(12) United States Patent
Suhara et al.

(10) Patent No.: US 6,769,172 B2
(45) Date of Patent: Aug. 3, 2004

(54) ELECTRIC-COMPONENT MOUNTING SYSTEM

(75) Inventors: Shinsuke Suhara, Kariya (JP); Yusuke Tsuchiya, Toyota (JP); Takayuki Mizuno, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 172 days.

(21) Appl. No.: 10/086,670

(22) Filed: Mar. 4, 2002

(65) Prior Publication Data

US 2002/0124393 A1 Sep. 12, 2002

(30) Foreign Application Priority Data

Mar. 7, 2001 (JP) ........................................ 2001-062862

(51) Int. Cl.⁷ ................................................. H05K 3/32
(52) U.S. Cl. ............................. 29/740; 29/743; 29/742; 29/741; 29/721; 29/832; 29/833; 29/DIG. 44; 414/737
(58) Field of Search ......................... 29/740, 741, 742, 29/720, 721, 759, DIG. 44, 832, 833, 334, 743; 294/64.1, 65; 901/40, 47; 414/737, 416.01

(56) References Cited

U.S. PATENT DOCUMENTS

| | | | | |
|---|---|---|---|---|
| 5,926,950 A | * | 7/1999 | Asai et al. | 29/832 |
| 6,079,096 A | * | 6/2000 | Hata et al. | 29/740 |
| 6,088,911 A | * | 7/2000 | Isogai et al. | 29/740 |
| 6,161,277 A | * | 12/2000 | Asai et al. | 29/740 |
| 6,507,997 B2 | | 1/2003 | Kawai et al. | 29/833 |
| 6,662,438 B2 | * | 12/2003 | Suhara et al. | 29/743 |
| 2001/0047581 A1 | * | 12/2001 | Suhara | 29/740 |

FOREIGN PATENT DOCUMENTS

| JP | A 4-348888 | 12/1992 |
|---|---|---|
| JP | A 6-342998 | 12/1994 |

* cited by examiner

*Primary Examiner*—Minh Trinh
(74) *Attorney, Agent, or Firm*—Oliff & Berridge, PLC

(57) ABSTRACT

An electric-component mounting system including: nozzle holders each carrying suction nozzles and rotatable to bring selected one of the suction nozzles; a turning device to turn the nozzle holders about a common axis of turning, for stopping each nozzle holder at predetermined working positions including nozzle-selecting, component-receiving and component-mounting positions; a holder rotating device which includes an engaging member engageable with and disengageable from an engaging portion of each nozzle holder, and which is disposed at the nozzle-selecting position, to rotate the nozzle holder, with the engaging member engaging the engaging portion; and an engaging-and-disengaging device to move the engaging member for engagement and disengagement with and from the engaging portion, and wherein each nozzle holder receives an electric component at the selected suction nozzle when each nozzle holder is located at the component-receiving position, and mounts the electric-component onto a circuit substrate while each nozzle holder is located at the component-mounting position. The holder rotating device is arranged to rotate the engaging member while permitting a movement of the engaging member in at least a direction of turning of each nozzle holder by the turning device.

13 Claims, 11 Drawing Sheets

ELECTRIC-COMPONENT MOUNTING SYSTEM

This application is based on Japanese Patent Application No. 2001-062862 filed on Mar. 7, 2001, the contents of which are incorporated hereinto by reference.

BACKGROUND OF THE INVENTION

1. Field of the Invention

The present invention relates in general to an electric-component mounting system arranged to mount electric components (typically, electronic components) on a circuit substrate, and more particularly to techniques for improving the efficiency of mounting of the electric components.

2. Discussion of Related Art

JP-A-6-342998 discloses an example of an electric-component mounting system including a plurality of component-holding heads which are arranged around a common axis of turning and turned about this common axis, to mount electric components on a circuit substrate. The component-holding heads are disposed on an indexing body rotatable about a vertical axis, such that the component-holding heads are equiangularly spaced apart from each other along a circle having a center on the vertical axis of rotation of the indexing body. With a rotary intermittent motion of the indexing body, the component-holding heads are turned about the vertical axis of rotation of the indexing body (which is the above-indicated common axis of turning of the heads). The indexing body has a plurality of working positions or stations at which the component-holding heads are temporarily stopped. These working positions includes a component-receiving position and a component-mounting position. At the component-receiving position, the component-holding head receives an electric component from a component supply device. At the component-mounting position, the electric component is transferred from the component-holding head onto the circuit substrate.

Each of the component-holding heads includes a plurality of suction nozzles, and a nozzle holder which holds those suction nozzles and is rotatable about an axis thereof to bring a selected one of the suction nozzles into the operating position. The nozzle holder is rotated by a nozzle-holder rotating device, and has an engaging portion. The nozzle-holder rotating device is disposed at one of the above-indicated plurality of working positions, and includes an engaging member engageable with and disengageable from the engaging portion of the nozzle holder, for rotating the nozzle holder so as to select one of the suction nozzles held by the nozzle holder. Conventionally, a head turning device including the indexing body for turning the component-holding heads about the above-indicated common axis of turning is held off until the desired suction nozzle has been brought into the operating position by the nozzle-holder rotating device. Where a nozzle-selecting time required for bringing the desired suction nozzle into the operating position is longer than the times required for completing the other working operations such as the time required for the component-holding heads to receive and hold the electric components and the time required for the heads to mount the electric components on the circuit substrate, the time during which the head turning device must be held off is determined by the nozzle-selecting time, which is the longest required working time. Thus, the nozzle-selecting time may be one of factors that lower the efficiency of component-mounting operations of the electric-component mounting system.

SUMMARY OF THE INVENTION

It is therefore an object of the present invention to provide an electric-component mounting system which assures an improvement in the efficiency of mounting of electric components. This object may be achieved according to any one of the following modes of the present invention in the form of an electric-component mounting system, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) An electric-component mounting system comprising:

a plurality of nozzle holders each of which carries a plurality of suction nozzles and is rotatable to bring a selected one of the suction nozzles into an operating position thereof, the each nozzle holder having an engaging portion:

a turning device operable to turn the plurality of nozzle holders about a common axis of turning, for sequentially stopping each of the nozzle holders at a plurality of predetermined working positions including a nozzle-selecting position, a component-receiving position and a component-mounting position, so that the each nozzle holder receives an electric component at the selected one suction nozzle placed in the operating position, when the each nozzle holder is located at the component-receiving position, and mounts the electric component onto a circuit substrate when the each nozzle holder is located at the component-mounting position;

a holder rotating device including an engaging member engageable with and disengageable from the engaging portion of the each nozzle holder, the holder rotating device being disposed at the nozzle-selecting position and operable to rotate the nozzle holder located at the nozzle selecting position, while the engaging member is in engagement with the engaging portion; and an engaging-and-disengaging device operable to move the engaging member for engagement and disengagement with and from the engaging portion, wherein the holder rotating device is arranged to rotate the engaging member, while permitting a movement of the engaging member in at least a direction of turning of each nozzle holder by turning device.

In the electric-component mounting system according to the above mode (1) of this invention, the holder rotating device is arranged to rotate the engaging member, while permitting a movement of the engaging member in the direction of turning of the nozzle holders by the turning device. This arrangement permits a rotary motion of the engaging member to be transmitted to the engaging portion of each nozzle holder, while the engaging member is moved in the direction of turning of the nozzle holder. Accordingly, at least a portion of the rotary motion of the nozzle holder to bring a selected one of the suction nozzles into the operating position can be effected while the nozzle holder is turned by the turning device. Conventionally, the rotation of the nozzle holder to select the desired suction nozzle is effected only while the nozzle holder is stopped at the nozzle-selecting position, that is, only while the turning of the nozzle holder is suspended. In this conventional arrangement, the nozzle holder is required to be stopped at the nozzle-selecting position for a comparatively long time, and this long stop time of the nozzle holder may be a factor that lowers the efficiency of mounting of the electric components. The holder rotating device arranged according to the present invention makes it possible to effectively avoid such a drawback. The holder rotating device may have a specific arrangement as described below with respect to the following mode (2), for rotating the engaging member while permitting the engaging member to be moved in at least the direction of turning of the nozzle holder by the turning device. However, the arrangement of the holder rotating device according to the following mode (2) is not essential. For instance, the holder rotating device may be arranged to rotate the engaging member while the holder rotating device as a whole is permitted to be moved in the direction of turning of the nozzle holder.

(2) An electric-component mounting system according to the above mode (1), wherein the holder rotating device further includes (i) a rotary member holding the engaging member and rotatable with the engaging member, (ii) a rotary drive device operable to rotate the rotary member and the engaging member, and (iii) a rotation transmitting device interposed between the engaging member and the rotary member and operable to transmit a rotary motion of the rotary member to the engaging member, while permitting the engaging member to be moved in at least the direction of turning of each nozzle holder by the turning device, and wherein the engaging-and-disengaging device moves the engaging member in an axial direction of the rotary member, for effecting engagement and disengagement of the engaging member with and from the engaging portion of each nozzle holder.

The holder rotating device provided according to the above mode (2) uses a relatively simple arrangement, namely, the rotation transmitting device interposed between the engaging member and the rotary member, for rotating the engaging member to rotate the nozzle holder while permitting the movement of the engaging member in the direction of turning of the nozzle holder by the turning device.

(3) An electric-component mounting system according to the above mode (1) or (2), wherein the engaging-and-disengaging device is operable to hold the engaging member in engagement with the engaging portion of each nozzle holder, for at least a predetermined period of time after initiation of a turning movement of each nozzle holder by the turning device from the nozzle-selecting position toward the component-receiving position.

In the electric-component system according to the above mode (3) wherein the engaging member is held in engagement with the engaging portion of the nozzle holder even after the turning movement of the nozzle holder from the nozzle-selecting position toward the component-receiving position, the engaging member is rotated to rotate the nozzle holder for bringing the selected suction nozzle into the operating position, while the engaging member is moved in the direction of turning of the nozzle holder as the nozzle holder is turned. Accordingly, the nozzle holder is not required to be held stopped at the nozzle-selecting position until the selected suction nozzle has been brought into the operating position. Thus, a sufficient time can be obtained for engagement of the engaging member with the engaging portion of the nozzle holder to rotate the nozzle holder for bringing the desired suction nozzle into the operating position, while reducing the required time of stopping of the nozzle holder at the nozzle-selecting position. The reduction of the stopping time of the nozzle holder makes it possible to reduce the required time of mounting of the electric components on the circuit substrate, leading to improved efficiency of operation of the system. Further, the engagement of the engaging member with the engaging portion of the nozzle holder may be initiated at a given point of time before the nozzle holder reaches the nozzle-selecting position. This arrangement also results in reducing the required time of stopping of the nozzle holder at the nozzle-selecting position. Usually, however, it is easier to hold the engaging member in engagement with the engaging portion even after the initiation of the turning movement of the nozzle holder from the nozzle-selecting position, than to initiate the engagement of the engaging member with the engaging portion during the turning movement of the nozzle holder to the nozzle-selecting position.

(4) An electric-component mounting system according to the above mode (2) or (3), wherein the rotation transmitting device permits the engaging member to be moved relative to the rotary member in all radial directions of the rotary member.

In the above mode (4), the engaging member can be smoothly moved in the direction of turning of the nozzle holder, following the turning movement of the nozzle holder by the turning device.

(5) An electric-component mounting system according to the above mode (4), wherein the rotation transmitting device includes an Oldham's coupling.

The rotation transmitting device may include a connecting shaft, and two universal joints, for instance. However, the rotation transmitting device preferably includes an Oldham's coupling or sliding coupling, which is comparatively simple and compact in construction.

(6) An electric-component mounting system according to any one of the above modes (2)–(5), wherein the holder rotating device includes a positioning device which normally holds a predetermined relative position of the engaging member and the rotary member, and which permits a movement of the engaging member from the predetermined relative position when a force acts on the engaging member in the direction of turning of each nozzle holder.

In the electric-component mounting system according to the above mode (6) wherein the predetermined relative position of the engaging member and the rotary member is maintained by the positioning device, the engaging member can be precisely brought into engagement with the engaging portion of the nozzle holder. When a force is applied to the engaging member in the direction of turning of the nozzle holder, the positioning device permits a movement of the engaging member from the predetermined position relative to the rotary member, so that the engaging member can be held in engagement with the engaging portion during at least a portion of the turning movement of the nozzle holder.

(7) An electric-component mounting system according to the above mode (6), wherein the positioning device includes at least one spring which is held in engagement with the engaging member and the rotary member, at respective opposite ends thereof.

The above-indicated at least one spring may be at least one spring in the form of a rod or wire. In this case, each rod or wire spring is fixed at its fixed end to one of the engaging member and the rotary member, such that the rod or wire spring extends in the axial direction of the rotary member, while the free end is fitted in a hole formed in the other of the engaging member and the rotary member.

(8) An electric-component mounting system according to the above mode (7), wherein the at least one spring consists of at least three plate springs which are arranged in a circumferential direction of the rotary member, each of the at least three plate springs being fixed at a fixed end thereof to one of the engaging member and the rotary member, and extending toward the other of the engaging member and the rotary member, each plate spring being held in contact with the above-indicated other of the engaging member and the rotary member such that each plate spring is slidable on the above-indicated other of the engaging member and the rotary member.

The plate springs are preferably disposed such that biasing forces of these plate springs act on the engaging member and the rotary member, in radial directions of the rotary member, so as to hold the engaging member and the rotary member in a coaxial relationship with each other. For instance, the plate springs are disposed symmetrically with each other with respect to the axis of the rotary member. This arrangement is effective to hold the engaging member and the rotary member in the coaxial relationship with each other. However, the symmetrical arrangement is not essential. While the plate springs may take the form of straight strips or sheets, the plate springs may take any other forms. For instance, each plate spring may have a curved intermediate portion which is curved in the radially outward direction of the rotary member, and two straight end portions which extend in the axial direction of the rotary member.

(9) An electric-component mounting system according to any one of the above modes (2)–(8), wherein the holder rotating device includes:

a stationary rotary drive source; and an axial-movement permitting device interposed between the stationary rotary drive source and the rotary member and operable to transmit a rotary motion of the rotary drive source to the rotary member while permitting a movement of the rotary member in an axial direction thereof.

(10) An electric-component mounting system according to any one of the above modes (2)–(8), wherein the holder rotating device includes:

a first rotary shaft disposed such that the first rotary shaft is rotatable and axially immovable;

a second rotary shaft disposed such that the second rotary shaft is rotatable and axially movable;

a connecting device which connects the first and second rotary shafts to each other, so as to permit an axial movement of the second rotary shaft relative to the first rotary shaft;

an axially moving device operable to move the second rotary shaft in the axial direction; and a stationary rotary drive source operable to rotate the first rotary shaft, and wherein the second rotary shaft functions as the rotary member, while the axially moving device functions as the engaging-and-disengaging device.

(11) An electric-component mounting system according to any one of the above modes (1)–(10), wherein each nozzle holder is rotatable about an axis which is perpendicular to the common axis of turning of the plurality of nozzle holders.

(12) An electric-component mounting system according to any one of the above modes (1)–(11), wherein the engaging portion of each nozzle holder has a plurality of straight engaging grooves formed in an end face of each nozzle holder which is perpendicular to an axis of rotation of each nozzle holder, the straight engaging grooves intersecting each other on the axis of rotation of each nozzle holder, the engaging member including a straight engaging tooth which is engageable with a selected one of the plurality of straight engaging grooves, and wherein the nozzle rotating device is operable to rotate the engaging member to an angular position in which the straight engaging tooth extends in a direction substantially parallel to a line of tangency to a circle along which each nozzle holder is turned, the straight engaging tooth extending in the direction substantially parallel to the above-indicated line of tangency when the straight engaging tooth is engaged with or disengaged from the selected one straight engaging groove.

In the electric-component mounting system according to the above mode (12), the engaging tooth is engaged with or disengaged from the engaging portion of each nozzle holder, with the engaging tooth extending in a direction parallel to or substantially parallel to the line of tangency to the circle along which the nozzle holders are turned. While the engaging tooth extends in the above-indicated direction, the engagement of the engaging tooth with the engaging portion can be initiated even where the engaging tooth and the engaging portion are misaligned with each other by a relatively large amount in the radial direction. In other words, the engaging member and the engaging portion may be relatively easily misaligned while the engaging member and the engaging portion are held in engagement with each other. The arrangement according to the above mode (12) is effectively combined with the feature according to the above mode (1) or (2) that the engaging member is movable in the direction of turning of the nozzle holder. Namely, a portion of the rotary motion of the nozzle holder required to bring the selected suction nozzle into the operating position can be effected with increased stability during a turning movement of the nozzle holder by the turning device.

(13) An electric-component mounting system according to any one of the above modes (1)–(12), wherein the turning device includes:

an indexing body rotatable about the common axis of turning of the nozzle holders;

an intermittently rotating device operable to rotate the indexing body at a predetermined angular pitch; and a plurality of nozzle-holder holding members disposed on the indexing body such that the nozzle-holder holding members are spaced apart from each other in a circumferential direction of the indexing body, the nozzle-holder holding members holding the plurality of nozzle holders, respectively, such that each nozzle holder is rotatable.

(14) An electric-component mounting system according to the above mode (13), wherein each of the nozzle-holder holding members comprises a holder shaft disposed on the indexing body such that the holder shaft is rotatable, the electric-component mounting system further including a nozzle rotating device operable to rotate the holder shaft for rotating the corresponding nozzle holder about a centerline of the selected suction nozzle placed in the operating position.

(15) An electric-component mounting system according to the above mode (13) or (14), wherein each of the nozzle-holder holding members comprises a holder shaft disposed on the indexing body such that the holder shaft is axially movable, the electric-component mounting system further including a nozzle moving device operable to move the holder shaft in an axial direction for moving the corresponding nozzle holder in a direction parallel to a centerline of the selected suction nozzle placed in the operating position.

BRIEF DESCRIPTION OF THE DRAWINGS

The above and other objects, features, advantages and technical and industrial significance of the present invention will be better understood by reading the following detailed description of a presently preferred embodiment of the invention, when considered in connection with the accompanying drawings, in which.

DETAILED DESCRIPTION OF THE PREFERRED EMBODIMENTS

Figure 1:
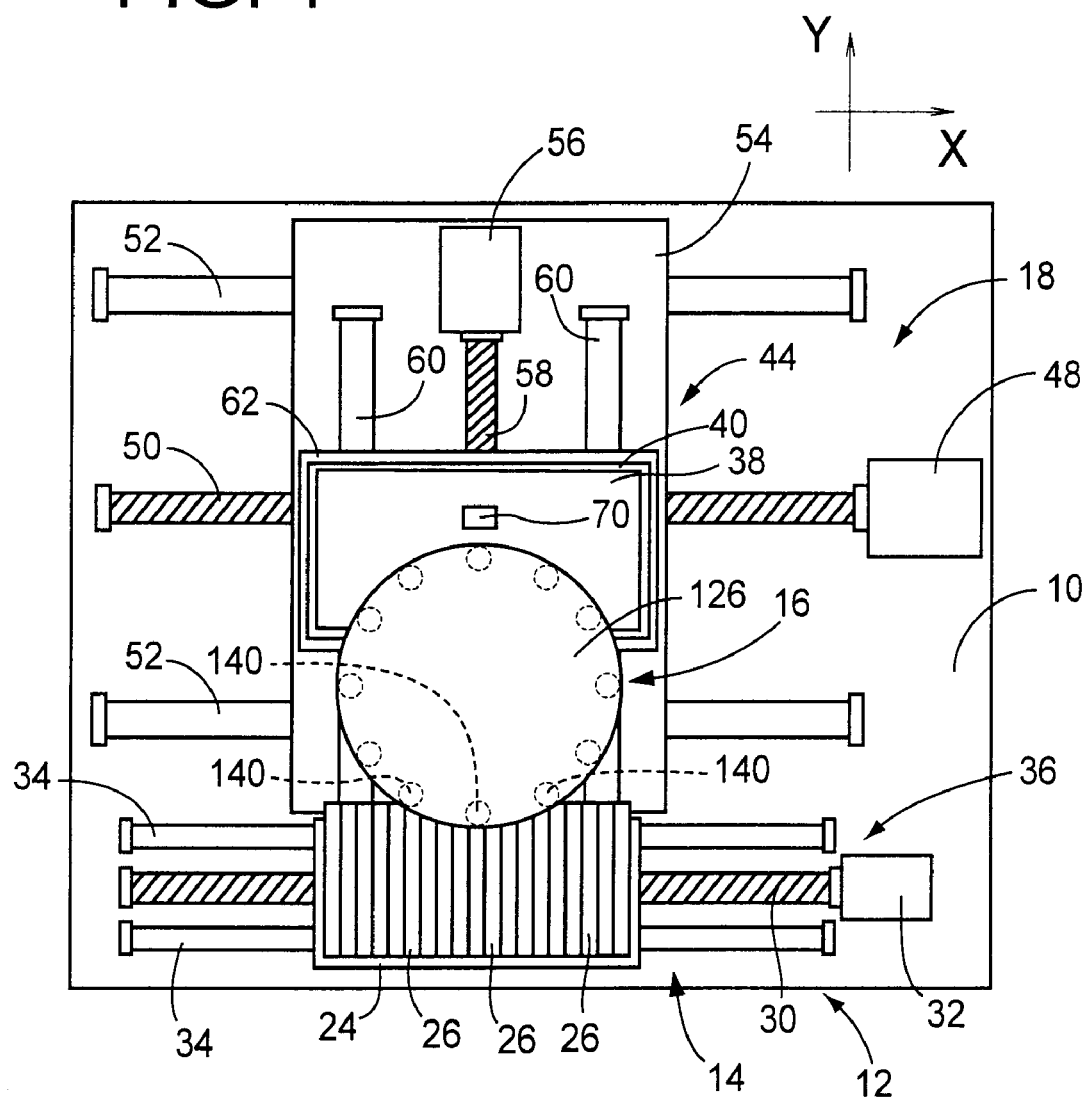
FIG. 1 is a plan view schematically showing an electric-component mounting system constructed according to one embodiment of this invention.

Referring first to FIG. 1, reference numeral 10 denotes a machine base of an electric-component mounting system 12. This system 12 includes a component supply device 14, a component mounting device 16 and a circuit-substrate supporting and positioning device in the form of a printed-wiring-board supporting and positioning device 18, which are all mounted on the machine base 10.

Figure 5:
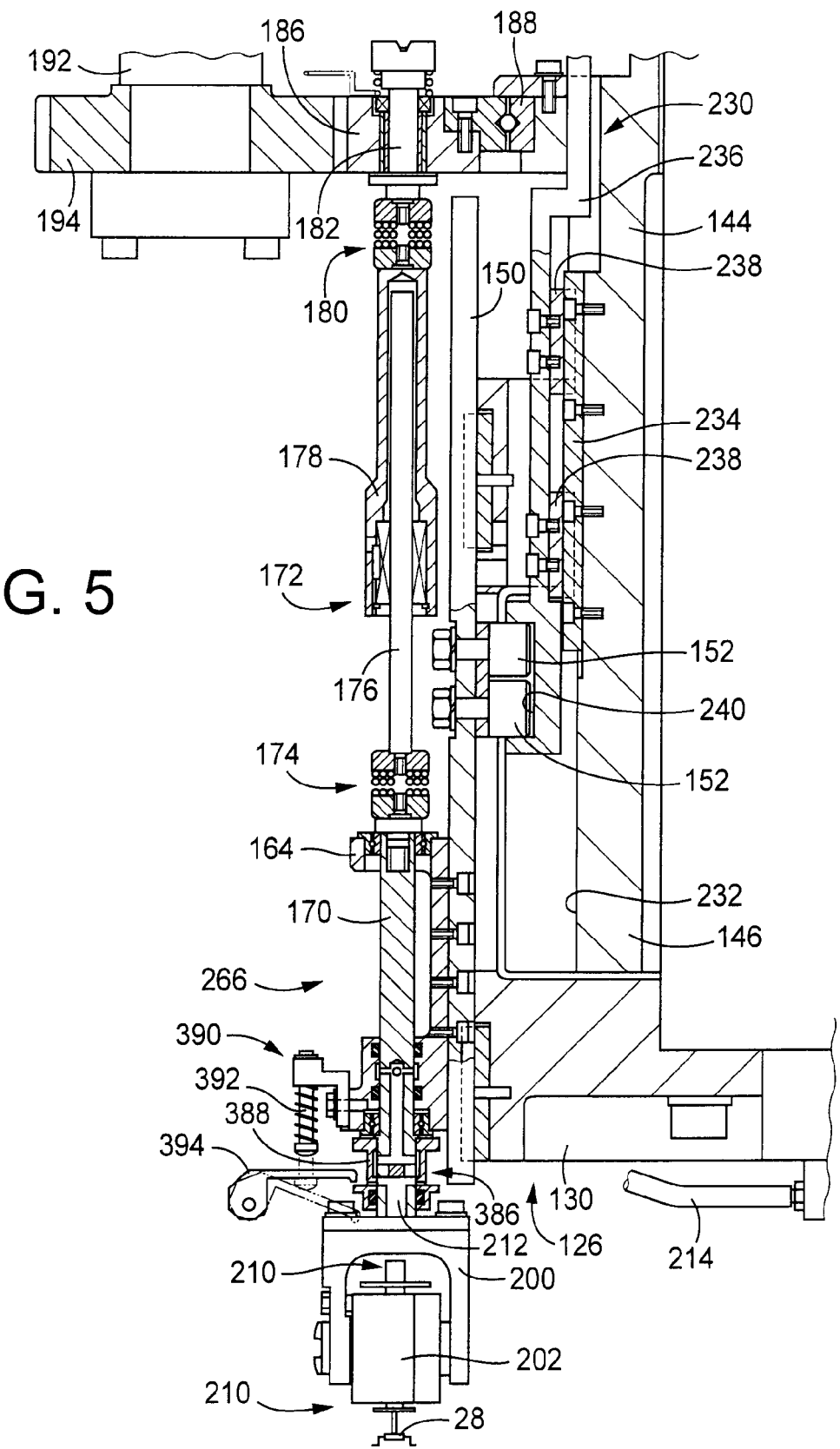
FIG. 5 is a front elevational view (partly in cross section) showing a part of a head lifting and lowering device of the component mounting device.

The component supply device 14 includes a plurality of tape feeders 26 mounted on a feeder support table 24. In the present embodiment, each of the tape feeders 26 is arranged to feed a carrier tape (not shown) which accommodates electric components (typically, electronic components) 28, one of which is shown in FIG. 5. The carrier tape includes a carrier substrate which has a multiplicity of component-accommodating recesses formed at a suitable interval along the length of the tape. The electric components 28 are accommodated in the respective component-accommodating recesses, and the opening of each recess is closed by a covering tape bonded to the carrier substrate. The carrier tape is fed by a tape feeding device while the covering tape is separated from the carrier substrate. Thus, the electric components 28 are fed one after another to a predetermined position at a component-supply portion of the tape feeder 26. The plurality of tape feeders 26 are removably mounted on the feeder support table 24 such that the component-supply portions of the tape feeders 26 are arranged along a straight line, namely, along a horizontal straight line in the present embodiment. The direction of extension of this straight line is referred to as an X-axis direction as indicated in FIG. 1. The tape feeders 26 may be replaced by bulk feeders arranged to feed the electric components one after another from respective bulk containers each accommodating the electric components in bulk. The bulk feeders may employ various types of feeding devices, which includes suitable feeding means such as air streams, ramps and vibrators. Alternatively, the component supply device may include tray-type feeders.

The feeder support table 24 is moved in the X-axis direction while being guided by a pair of guide rails 34, by rotation of a feedscrew in the form of a ballscrew 30 by a table drive motor 32, so that a selected one of the tape feeders 26 can be moved to a predetermined component-supply position. The ballscrew 30 and the table drive motor 32 cooperate to constitute a major portion of a table drive device 36.

The printed-wiring-board supporting and positioning device 18 (hereinafter referred to as "PWB supporting and positioning device") includes a printed-wiring-board supporting device (hereinafter referred to as "PWB supporting device") 40 arranged to support the printed-wiring board 38 on which the electric components 28 are to be mounted, and a printed-wiring-board positioning device (hereinafter referred to as "PWB positioning device") 44 arranged to move the PWB supporting device 40, for thereby positioning the printed-wiring board 38. The printed-wiring board 38 is one form of a printed board, that is a circuit substrate which have printed circuits and on which no electric components have been mounted or electric components have been mounted for some of the circuits. The printed board may be a printed-circuit board on which electric components have been mounted and electric connections have been completed. The PWB positioning device 44 includes an X-axis slide 54, and a Y-axis slide 62 movably mounted on the X-axis slide 54. The X-axis slide 54 is movable in the X-axis direction by an X-axis drive motor 48 through a feedscrew in the form of a ballscrew 50 while being guided by guide rails 52, while the Y-axis slide 62 is movable in a Y-axis direction (perpendicular to the X-axis direction) by a Y-axis drive motor 56 through a feedscrew in the form of a ballscrew 58 while being guided by guide rails 60. The PWB supporting device 40 rests on the Y-axis slide 62, and the printed-wiring board 38 is supported by the PWB supporting device 40 such that the board 38 maintains a horizontal attitude or posture in which an upper surface or component-mounting surface 64 (FIG. 2) of the board 38 is parallel to an XY plane defined by the mutually perpendicular X-axis and Y-axis directions. The PWB supporting device 40 is moved by the PWB positioning device 44 in the XY plane (horizontal plane parallel to the component-mounting surface 64), so that a selected portion of the surface 64 is located at a predetermined component-mounting position described below.

The printed-wiring board 38 is provided with a plurality of fiducial marks (not shown), two fiducial marks in this embodiment, on its component-mounting surface 64. The present electric-component mounting system 12 is provided with an image-taking device in the form of a stationary fiducial-mark camera 70, as shown in FIG. 1. The fiducial-mark camera 70 is arranged to take images of the fiducial marks on the printed-wiring board 38 as held by the PWB supporting device 40. The fiducial-mark camera 70 includes CCDs (charge-coupled devices) and a lens system. The CCDs are small-sized light-sensitive elements arranged in a matrix in a plane. Each of the light-sensitive elements generates an electric signal depending upon amount of light received. The matrix of the light-sensitive elements defines an imaging area in which a two-dimensional image of an object is formed at one time. An illuminating device (not shown) is provided near the fiducial-mark camera 70, to illuminate the object and its vicinity when the image of the object is taken by the camera 70.

Referring to FIGS. 2–6, the component mounting device 16 will be described only briefly since the component mounting device 16 per se does not significantly relate to the present invention. The component mounting device 16 in the present embodiment is similar in construction to a component mounting device as disclosed in JP-A-6-342998.

Figure 2:
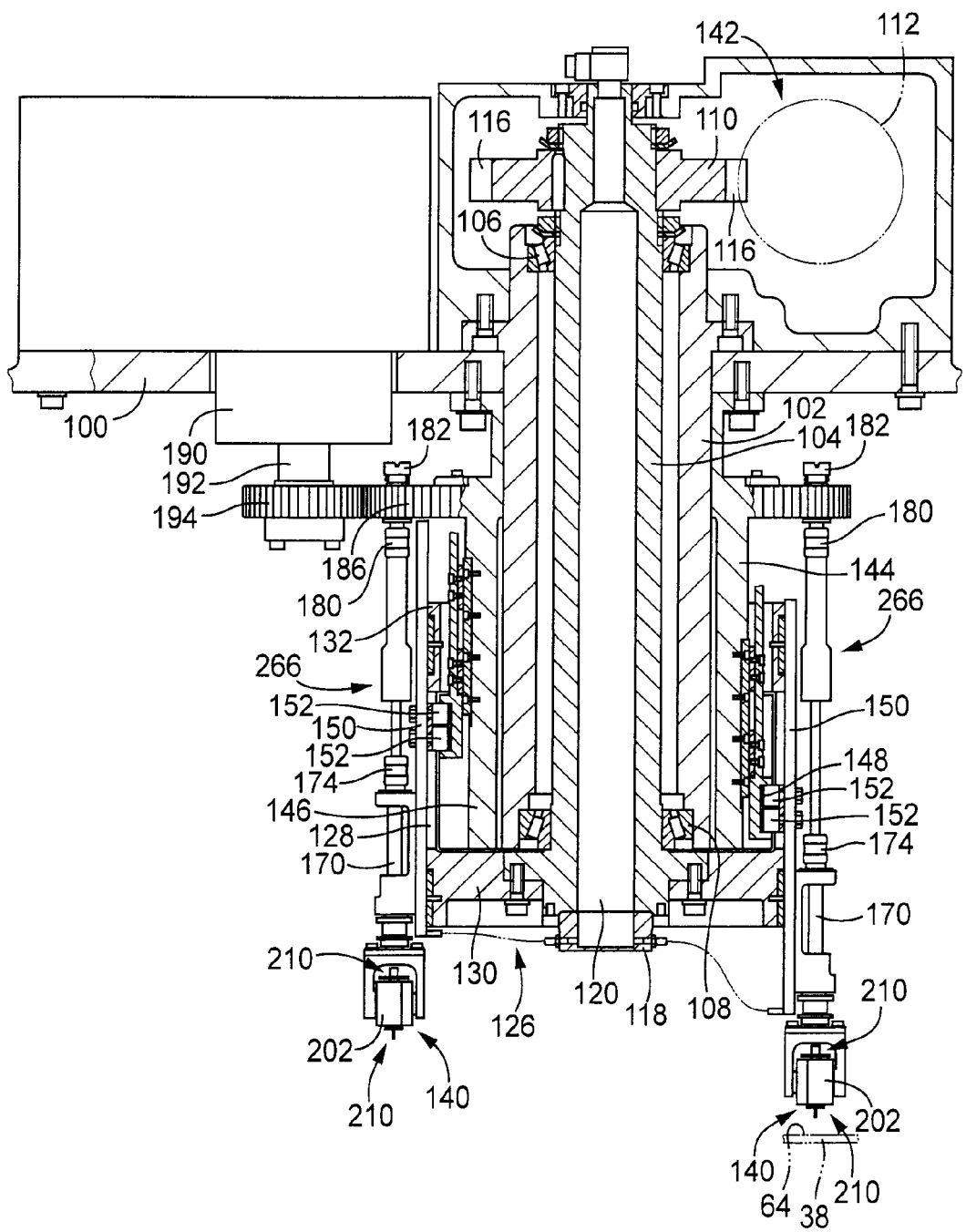
FIG. 2 is a front elevational view (partly in cross section) showing an electric-component mounting device of the electric-component mounting system of FIG. 1.
Figure 8:
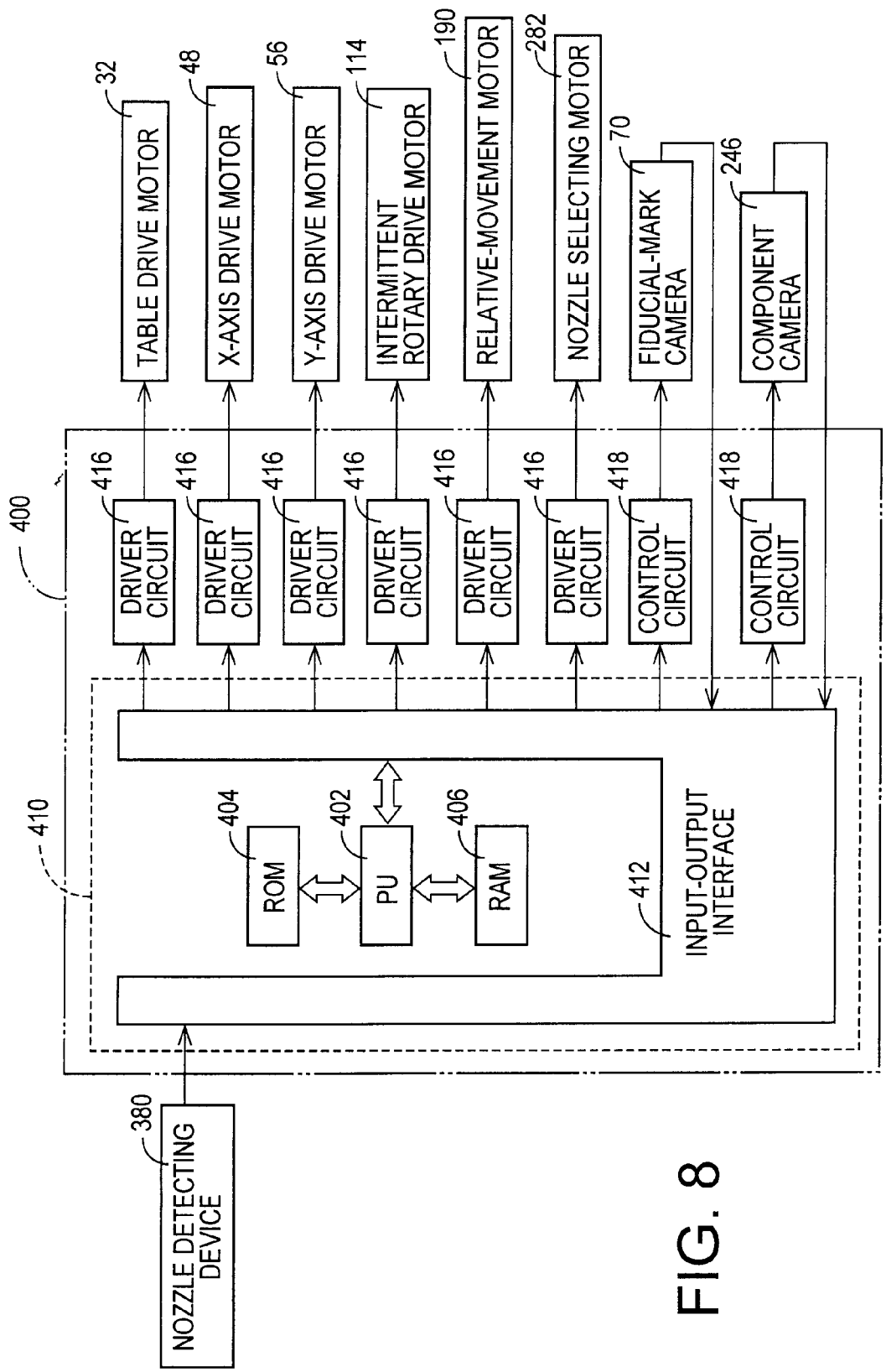
FIG. 8 is a block diagram illustrating a portion of a control device of the electric-component mounting system, which closely relates to the present invention.

In FIG. 2, reference numeral 100 denotes a frame supported by the machine base 10. On the frame 100, there is fixedly mounted a cylindrical member 102 extending in the vertical direction, such that the cylindrical member 102 is fixed at its upper portion on the frame 100, while its lower portion extends downwards from the frame 100. A rotary shaft 104 extends through a bore of the cylindrical member 102 and is supported by the cylindrical member 102 through bearings 106, 108, rotatably about its vertical axis. A roller gear 110 is attached to an upper end portion of the rotary shaft 104 which extends upwards from the cylindrical member 102. The roller gear 110 has a plurality of rotatably supported rollers 116 which are sequentially engageable with a cam 112, when the cam 112 is rotated by a drive source in the form of an intermittent rotary drive motor 114 (FIG. 8) in a predetermined direction at a predetermined constant speed. Thus, the rotary shaft 104 is intermittently rotated about the vertical axis, by a predetermined angle for each intermittent rotary motion thereof. The lower open end of the rotary shaft 104 is closed by a covering member 118, and a bore of the rotary shaft 104 serves as a vacuum passage 120 connected to a negative-pressure source (not shown).

A rotary body in the form of an indexing body 126 is fixed to the lower end portion of the rotary shaft 104 which extends downwards from the cylindrical member 102. As shown in FIG. 2, the indexing body 126 includes a cylindrical portion 128, an annular disk portion 130, and a ring portion 132. The cylindrical portion 128 has an inside diameter larger than an outside diameter of the cylindrical member 104. The annular disk portion 130 is located adjacent to the lower end of the cylindrical portion 128, while the ring portion 132 is located adjacent to the upper end of the cylindrical portion 128.

Figure 3:
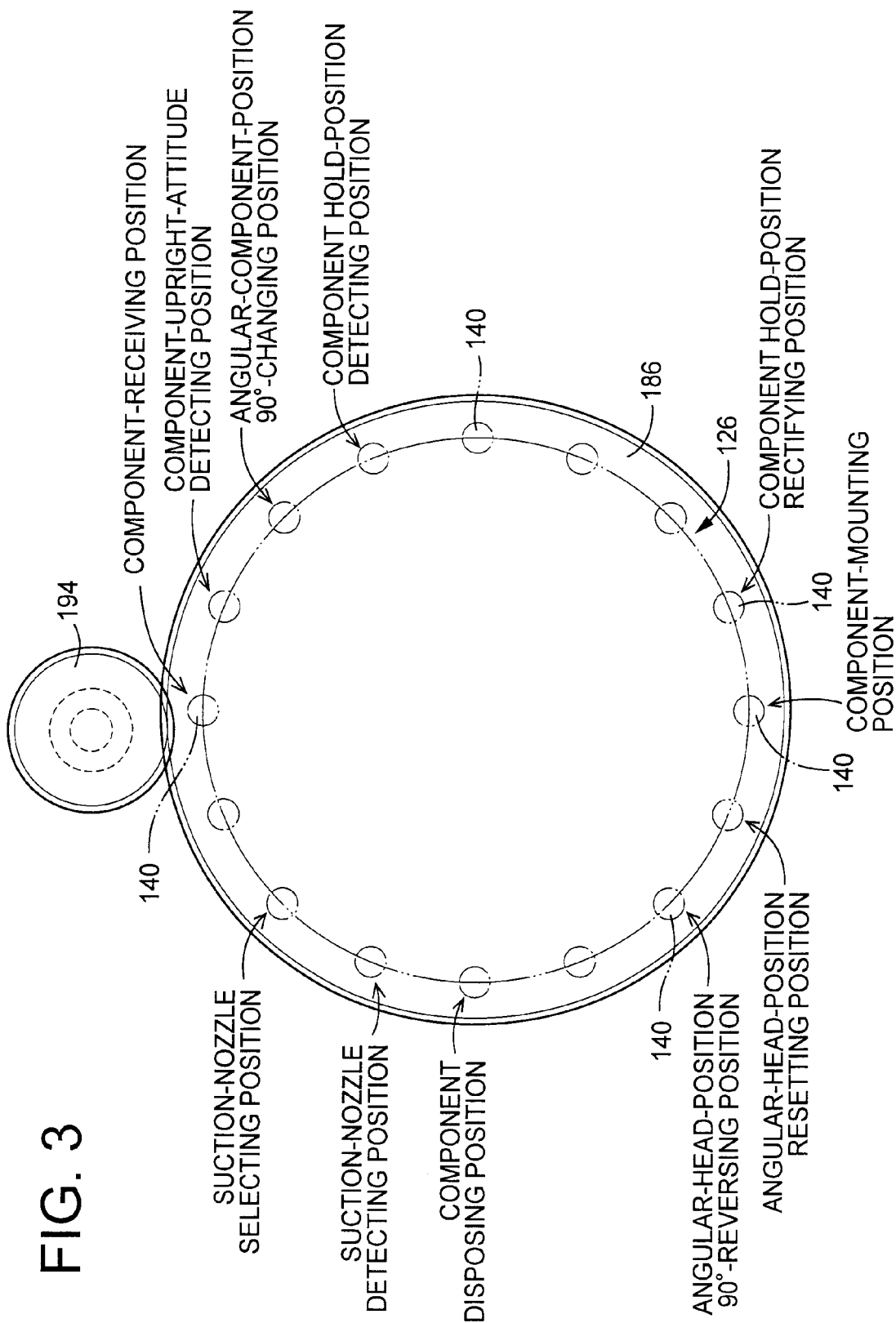
FIG. 3 is a view schematically showing working positions of component-holding heads of the electric-component mounting device of FIG. 2

As schematically shown in FIG. 3, the indexing body 126 carries a total of 16 component-holding devices in the form of 16 component-holding heads 140 arranged equiangularly along a circle having a center on the axis of rotation of the rotary shaft 104, and a total of 16 working stations or positions at which the 16 component-holding heads 140 are sequentially stopped. The 16 working positions include eight head-working positions at which each component-holding head 140 performs respective working operations. These eight working positions are: 1) component-receiving position (component-sucking or pick-up position); 2) angular-component-position 90°-changing position; 3) component-hold-position rectifying position; 4) component-mounting position; 5) angular-head-position resetting position; 6) angular-head-position 90°-reversing position; 7) component disposing position; and 8) suction-nozzle selecting position. The 16 working positions include three detecting positions: a) component-upright-attitude detecting position; b) component-hold-position detecting position; and c) suction-nozzle detecting position. The 16 working positions include five unassigned positions. When the indexing body 126 is intermittently rotated, the 16 component-holding heads 140 are turned about a common axis, that is, about the vertically extending axis of rotation of the rotary shaft 104, so that the component-holding heads 140 are sequentially stopped at the component-mounting position.

Figure 4:
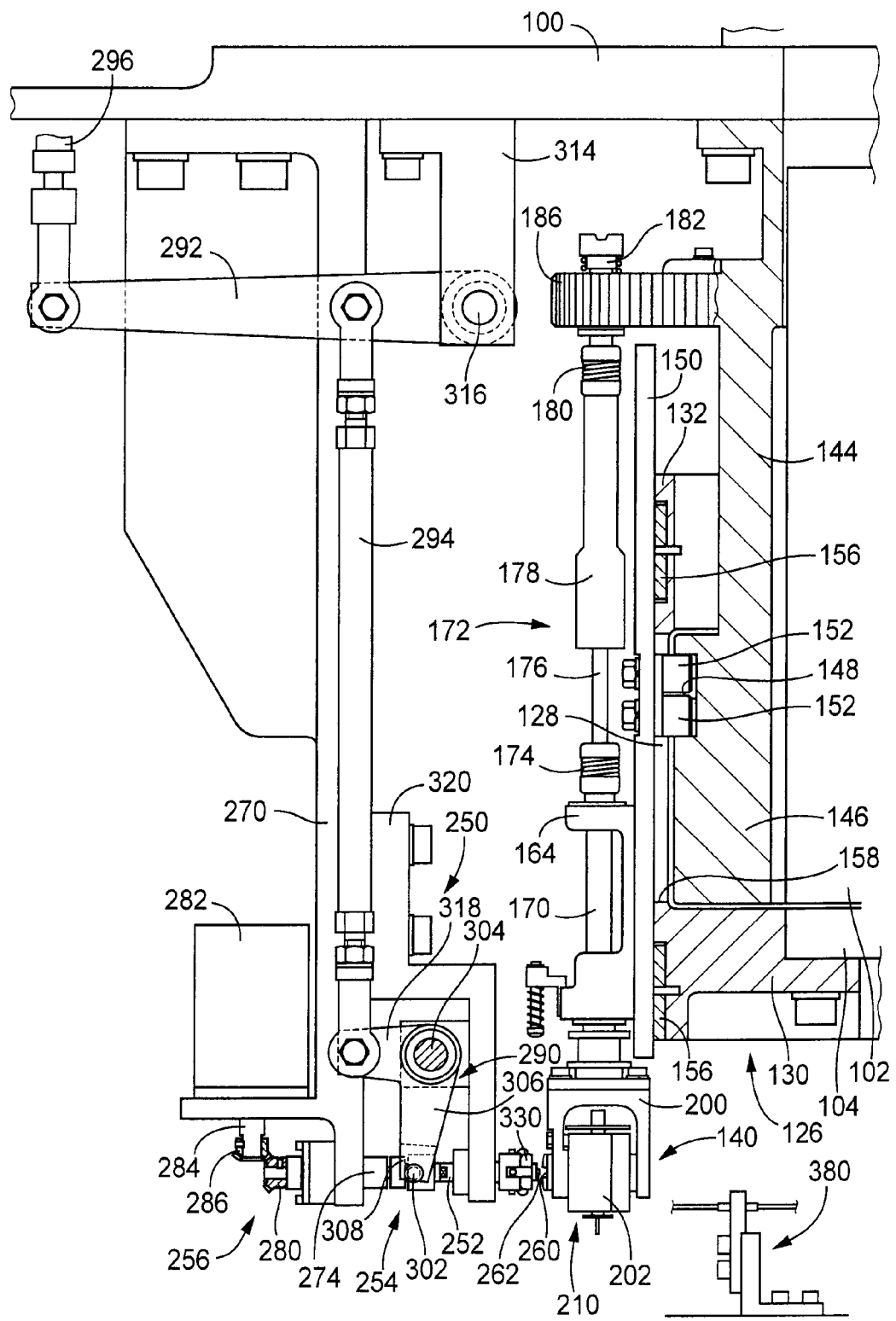
FIG. 4 is a front elevational view (partly in cross section) showing one of the component-holding heads and a nozzle selecting device of the component mounting device.

As shown in FIG. 2, a stationary cylindrical cam 144 is attached to the underside of the frame 100, such that the cylindrical cam 144 is disposed radially outwardly of the cylindrical member 102, while a lower end portion of the cylindrical cam 144 is interposed between the indexing body 126 and the lower end portion of the cylindrical member 102. The cylindrical cam 144 is a stepped cylindrical member having a lower end portion consisting of a large-diameter portion 146 fitted in the cylindrical portion 128 of the indexing body 126. The large-diameter portion 146 has a cam groove 148 formed in its outer circumferential surface, as shown in FIGS. 2 and 4. A pair of rollers 152 rotatably attached to each of 16 vertically movable members in the form of plates 150 are held in engagement with the cam groove 148, while extending through an elongate hole 158 (FIG. 4).

As shown in FIG. 4, a total of 16 pairs of guide blocks 156 are attached to the annular disk portion 130 and the ring portion 132 of the indexing body 126 such that the 16 pairs of guide blocks 156 are equiangularly spaced from each other in the circumferential direction of the indexing body 126. The two guide blocks 156 of each pair are spaced apart from each other in the axial direction of the indexing body 126, namely, in the vertical direction. The 16 vertically movable plates 150 are held in engagement with the respective pairs of guide blocks 156 such that each vertically movable plate 150 is vertically movable. The 16 component-holding heads 140 are held by the respective 16 vertically movable plates 150.

The cam groove 148 is formed in the outer circumferential surface of the large-diameter portion 146 of the cylindrical cam 144, such that the height of the cam groove 148 gradually changes in the circumferential direction of the cylindrical cam 144, over selected two portions of the circumference of the cylindrical cam 144. When the component-holding heads 140 are turned with the vertically movable plates 150 about the axis of the indexing body 126, with an intermittent rotary motion of the indexing body 126, the pairs of rollers 152 are moved in the helical cam groove 148, so that the vertically movable plates 150 are vertically moved to vertically move the corresponding component-holding heads 140. The cam groove 148 is formed such that the component-holding head 140 located at the component-receiving position (component-sucking position) is located at the uppermost position, while the component-holding head 140 located at the component-mounting position is located at the lowermost position. That is, each component-holding head 140 receives the electric component 28 from the appropriate tape feeder 26 when this head 140 is located at the component-receiving position and at the uppermost position. The component-holding head 140 is lowered to the lowermost position while this head 140 is turned to the component-mounting position at which the electric component 28 is mounted on the printed-wiring board 38. The height of the cam groove 148 remains unchanged over two other portions of the circumference of the cylindrical cam 144 other than the above-indicated selected two portions, so that each component-holding head 140 is turned without a vertical movement, along the above-indicated two other portions of the circumference of the cam 144, which are intermediate between the component-receiving and component-mounting positions in the rotating direction of the indexing body 126.

A vertically movable member in the form of a rod 170 is supported by a support member 164 attached to the outer surface of each of the vertically movable plates 150, as shown in FIG. 4, such that the vertically movable rod 170 is not axially movable relative to the support member 164 and is rotatable about its vertically extending axis. The vertically movable rod 170 is connected to a rotation transmitting shaft 172 to which a rotary motion is transmitted from each of: an angular-component-position 90°-changing device disposed at the angular-component-position 90°-changing position; a component hold-position rectifying device disposed at the component-hold-position rectifying position; an angular-head-position resetting device disposed at the angular-head-position resetting position; and an angular-head-position 90°-reversing device disposed at the angular-head-position 90°-reversing position. The component-holding head 140 is rotated about its axis by the vertically movable rod 170 when the rotary motion is transmitted from each of the above-indicated devices to the rod 170 through the rotation transmitting shaft 172. As shown in FIGS. 4 and 5, the rotation transmitting shaft 172 includes: a spline shaft 176 connected to the vertically movable rod 170 through a universal joint 174; a sleeve 178 fitted on the spline shaft 176 such that the sleeve 178 is axially movable relative to the spline shaft 176 but is not rotatable relative to the spline shaft 176; and an engaging member 182 connected to the sleeve 178 through a universal joint 180. The rotation transmitting shaft 172 is telescopically elongated and contracted with a relative axial movement of the spline shaft 176 and the sleeve 178.

The engaging member 182 of the rotation transmitting shaft 172 is fitted in an externally toothed ring gear 186 such that the engaging member 182 is axially movable and rotatable relative to the ring gear 186. As shown in FIG. 5, the externally toothed ring gear 186 is mounted on the upper portion of the cylindrical cam 144 through a bearing 188 such that the ring gear 186 is rotatable about the axis of the indexing body 126.

The externally toothed ring gear 186 is held in meshing engagement with a drive gear 194 which is fixed to an output shaft 192 of a relative-movement motor 190 (shown in FIG. 2). The ring gear 186 is rotated by the relative-movement motor 190 about the axis of the indexing body 126, at an angular velocity different from that of the indexing body 126.

Figure 6:
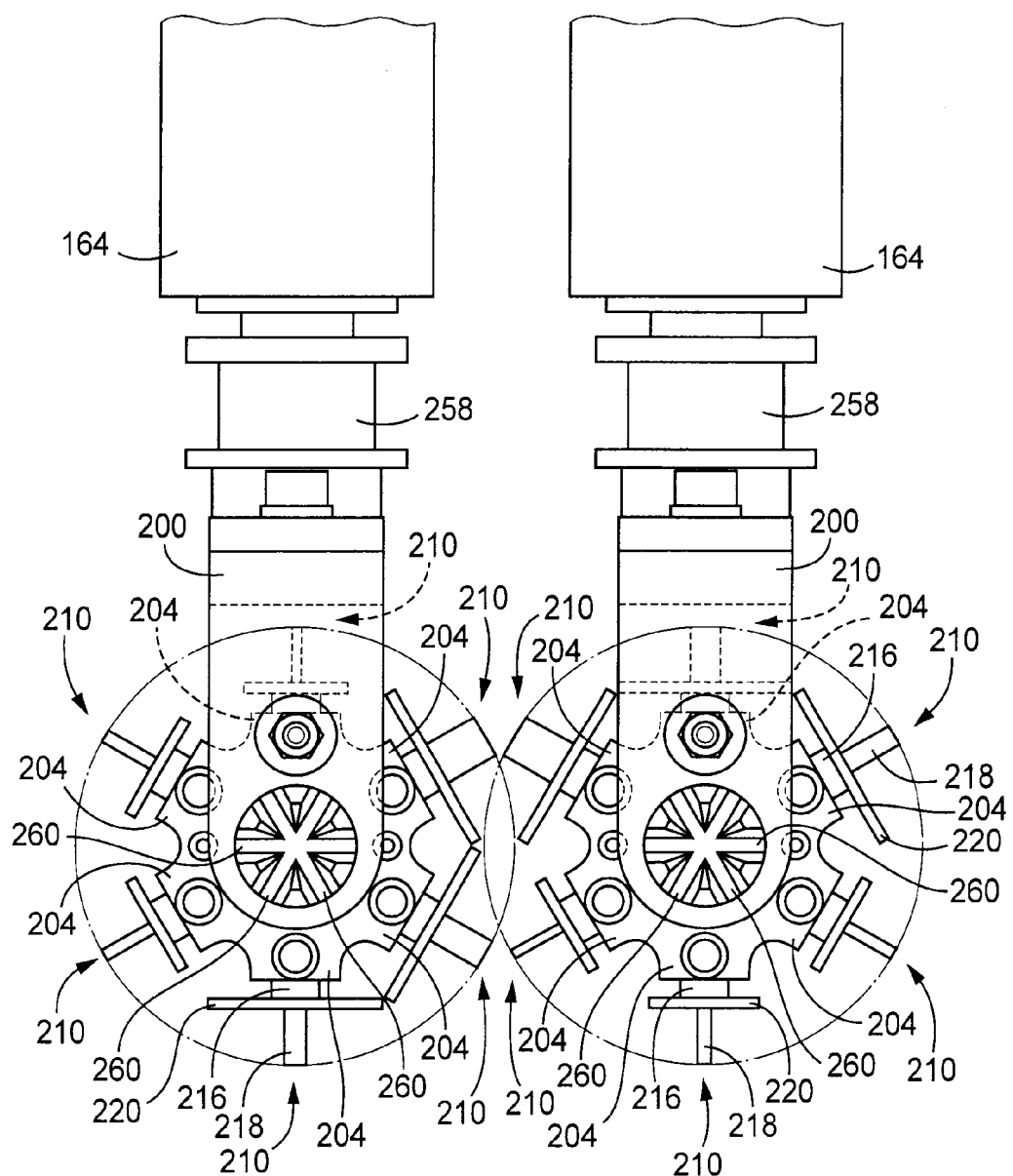
FIG. 6 is a front elevational view showing the two adjacent component-mounting heads of the component mounting device, each head carrying six suction nozzles.

As shown in FIGS. 4 and 5, a support member 200 is removably attached to the lower end portion of the vertically movable rod 170. The support member 200 supports a component-holder support member in the form of a nozzle holder 202 such that the nozzle holder 202 is rotatable about a horizontal axis perpendicular to the axis of rotation of the indexing body 126. The nozzle holder 202 has six nozzle-holding portions 204 that are equiangularly spaced from each other in the rotating direction of the nozzle holder 202, as shown in FIG. 6. Each nozzle-holding portion 204 is arranged to hold a component holder in the form of a suction nozzle 210. Thus, the six suction nozzles 210 are removably held by the nozzle holder 202 such that the suction nozzles 210 extend in the radial direction of the nozzle holder 202 and are arranged at a predetermined angular interval in the rotating direction of the nozzle holder 202. In FIGS. 2, 4 and 5, only the two suction nozzles 210 are shown, in the interest of brevity. Each suction nozzle 210 is arranged to hold the electric component 28 by suction under a negative pressure. The nozzle holder 202 has a passage (not shown) communicating with the above-indicated vacuum passage 120 through a passage 212 formed through the vertically movable rod 170, and a hose 214 (shown in FIG. 5).

As shown in FIG. 6, each suction nozzle 210 has a nozzle body 216, a suction tube 218 and a light-emitting body in the form of a light-emitting plate 220 serving as a light emitting member. The light-emitting plate 220 absorbs a ultraviolet radiation received from a ultraviolet-radiation emitting device disposed at the component-hold-position detecting position, and emits a visible light. The suction tube 218 and the light-emitting plate 220 of each suction nozzle 210 have sizes suitable for a particular kind or type of the electric component 28 (FIG. 5). The six suction nozzles 210 are used to hold the electric components 28 having respective different sizes (different height dimensions and/or masses), and the suction tubes 218 of the six suction nozzles 210 have respective different diameters. All of the suction tubes 218 have the same length.

As indicated above, the angular-component-position 90°-changing device, component hold-position rectifying device, angular-head-position resetting device and angular-head-position 90°-reversing device are disposed at the angular-component-position 90°-changing position, component hold-position rectifying position, angular-head-position resetting position and angular-head-position 90°-reversing position, respectively. Each of these devices includes: a first engaging member engageable with and disengageable from the second engaging member 182 of the rotation transmitting shaft 172 of each component-holding head 140; a connecting device for selective engagement or disengagement of the first engaging member with or from the second engaging member 182; and a rotating device for rotating the first engaging member. The connecting device uses the intermittent rotary drive motor 114 as a drive source, a rotary motion of which is converted into a linear vertical motion of the first engaging member by a motion-transmitting or motion-converting device including a cam and a cam follower.

The rotating device of each of the component hold-position rectifying device and the angular-head-position resetting device uses an exclusive servomotor as a drive source, for rotating the engaging member by a desired angle in a selected one of the clockwise and counterclockwise directions. The rotating device of each of the angular-component-position 90°-changing device and the angular-head-position 90°-reversing device uses the intermittent rotary drive motor 114 as a drive source, a rotary motion of which is converted into a 90° rotation of the engaging member in a selected one of the clockwise and counterclockwise directions, by a motion-converting or motion-transmitting device.

The cylindrical cam 144 attached to the frame 100 has two axially moving devices in the form of two head lifting and lowering devices 230 at respective circumferential positions corresponding to the component-receiving and component-mounting positions, as shown in FIG. 5 (in which there is shown only the head lifting and lowering device 230 corresponding to the component-receiving position). These head lifting and lowering devices 230, which are arranged to vertically move the component-holding heads 140, have the same construction. Only the head lifting and lowering device 230 corresponding to the component-receiving position will be described by way of example.

The cylindrical cam 144 has a guide groove 232 formed in a circumferential portion thereof corresponding to the component-receiving position such that the guide groove 232 extends vertically in the axial direction of the indexing body 126. To the bottom surface of a vertically intermediate part of the guide groove 232, there is fixed a guide member in the form of a guide plate 234. Two guide blocks 238 fixed to a vertically movable member 236 are held in sliding contact with the guide plate 234. The vertically movable member 236 has a width substantially equal to that of the guide groove 232, for engagement with the guide groove 232. The lower end portion of the vertically movable member 236 has an engagement groove 240 which is open in the radially outward direction of the cylindrical cam 144 and which extends in the horizontal direction. The engagement groove 240 has the same width (dimension in the axial direction of the indexing body 126) as that of the cam groove 148. The vertically movable member 236 is vertically moved by a motion-converting mechanism, which includes a cam, a cam follower and a motion-transmitting mechanism and which is arranged to convert a rotary motion of the intermittent rotary drive motor 114 into a linear vertical motion of the vertically movable member 236 when the component-holding head 140 is required to be vertically moved. The motion-converting mechanism for the vertically movable member 236 may have an arrangement similar to that in an electric-component mounting system disclosed in JP-A-4-345097.

The cam follower of the motion-converting mechanism of the head lifting and lowering device 230 is movable between an operable position for engagement with the cam, and an inoperable position spaced apart from the cam. When the cam follower is placed in its inoperable position when the component-holding head 140 is located at the component-receiving or component-mounting position, the head 140 does not perform its action to receive the electric component 28 or mount the electric component 28 on the printed-wiring board 38.

At the component hold-position detecting position, a component camera 246 (indicated in FIG. 8) is disposed for taking an image of the electric component 28 as held by the suction nozzle 210 of the component-holding head 140 located at the component hold-position detecting position. Like the fiducial-mark camera 70, the component camera 246 is a two-dimensional imaging device using CCDs. The component camera 246 fixedly disposed at the component hold-position detecting position which lies on a circle along which the component-holding head 140 is turned. This component camera 246 is oriented so as to face downwards and receive a light from the electric component 28 through an optical guiding device which includes a reflecting mirror.

The intermittently rotated indexing body 126 is one form of a rotary body, and cooperates with the rotary shaft 104, roller gear 110, cam 112 and intermittent rotary drive motor 114 to constitute an intermittently rotating device in the form of a head turning device 142. The intermittently rotating device may include an electric motor as a drive source arranged to directly turn the component-holding heads 140 about a common vertical axis. The vertically movable rod 170 is an example of a head holding shaft serving as a head holder which holds the corresponding component-holding head 140 and which is disposed on a circle having a center at the axis of rotation of the indexing body 126 such that the head holder is movable in the axial direction of the indexing body 126. The rotation transmitting shafts 172 are an example of a plurality of nozzle-holder holding members in the form of shafts which hold the respective nozzle holders 202 and which are disposed on the indexing body 126 such that the nozzle-holder holding members are spaced apart from each other in the circumferential direction of the indexing body 126 and such that each nozzle holder 202 is rotatable about an axis parallel to the axis of rotation of the indexing body 126. A turning device comprises the intermittently rotating device including the rotary body, and the nozzle-holder holding members. A nozzle rotating device for rotating the presently selected suction nozzle 210 is constituted by the vertically movable rod 170, the rotation transmitting shaft 172, and the intermittent rotary drive motor 114 and the motion-converting mechanisms (each including a cam and a cam follower, as described above) which are respectively provided for the component hold-position rectifying device, angular-component-position 90°-changing device, angular-head-position resetting device and angular-head-position 90°-reversing device (each of which includes the first engaging member engageable with the second engaging member 182 of the rotation transmitting shaft 172, the connecting device for selective engagement or disengagement of the first engaging member with or from the second engaging member 182; and the rotating device for rotating the first engaging member, as described above).

The axis of rotation of the nozzle holder 202 is perpendicular to the axis of rotation of the vertically movable rod 170. The nozzle holder 202 is rotated to bring a selected one of the six suction nozzles 210 to its operating position in which the selected suction nozzle 210 extends in the vertical direction, with its suction tube 218 being open downwards. The axis of the suction nozzle 210 placed in the operating position is aligned with the axis of the vertically movable rod 170. It will be understood that the component-holding head 140 is constituted by the suction nozzle 210 placed in the operating position, the nozzle holder 202 holding this suction nozzle 210, and the vertically movable rod 170, and that the component-holding head 140 and the other suction nozzles 210 placed in their non-operating positions cooperate to constitute a component-mounting unit or component-holding unit 266. Each suction nozzle 210 may be considered to be a part of the component-holding head 140. In this case, the component-mounting device 16 is considered to have a total of 96 component-holding heads, namely, six component-holding heads 140 held by each of the 16 nozzle holders 202.

Figure 7:
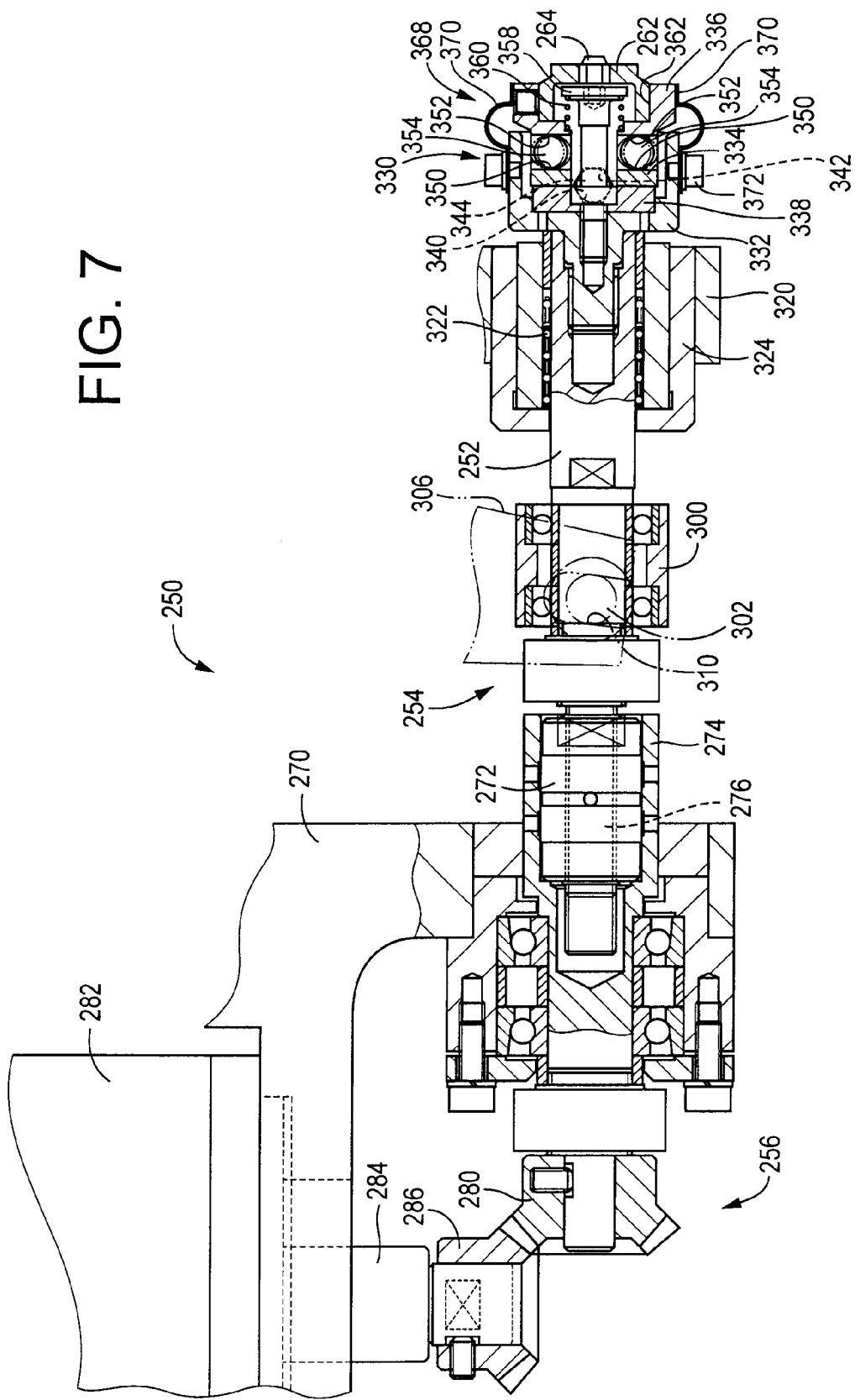
FIG. 7 is a front elevational view in cross section showing the nozzle selecting device of FIG. 4.
Figure 11:
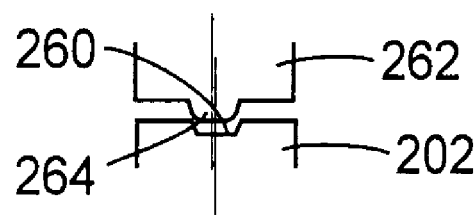
FIG. 11 is a front elevational view showing a state of engagement between an engaging member of the nozzle selecting device and an engaging portion of a nozzle holder of each component-holding head, at point A indicated in FIG. 10 (at a point shortly before the suction-nozzle selecting position)
Figure 12:
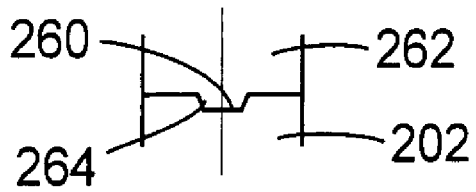
FIG. 12 is a front elevational view showing a state of engagement between the engaging member of the nozzle selecting device and the engaging portion of the nozzle holder, at point B indicated in FIG. 10 (at a point between the suction-nozzle selecting position and the next working portion).

As shown in FIG. 4, the nozzle holder 202 of each component-holding head 140 is rotated by a nozzle selecting device 250 disposed at the suction-nozzle selecting position indicated in FIG. 3. The nozzle selecting device 250 includes a rotary drive member 252, an engaging-and-disengaging device 254 and a rotary-member rotating device 256. As shown in FIG. 6, the nozzle holder 202 has an engaging portion in the form of three engaging grooves 260 formed in one end face perpendicular to the axis of rotation. The engaging grooves 260 are formed so as to intersect with each other at the axis of rotation of the nozzle holder 202. On the other hand, the rotary drive member 252 is provided at one axial end thereof with an engaging member 262 which has an integrally formed elongate straight engaging tooth 264, as shown in FIG. 7. The nozzle holder 202 is rotated to select one of the six suction nozzles 210 into the operating position, by rotation of the rotary drive member 252 by the rotary-member rotating device 256 while the engaging tooth 264 is held in engagement with one of the engaging grooves 260. As shown in FIGS. 11 and 12, each of the engaging grooves 260 has a trapezoidal shape in cross section, having a pair of side surfaces inclined such that the width of each trapezoidal engaging groove 260 is larger at its opening than at its bottom. Similarly, the engaging tooth 264 has a trapezoidal shape in cross section, having a pair of side surfaces inclined such that the width of each trapezoidal engaging tooth 264 is larger at its bottom than at its top, as also shown in FIGS. 11 and 12. Accordingly, the engaging tooth 264 can be easily brought into engagement with one of the engaging grooves 260, with the inclined side surfaces serving as guide surfaces, even if the engaging tooth 264 is misaligned with the appropriate engaging groove 260 in the direction of width. However, the inclination of both of the two side surfaces of each engaging groove 260 and the engaging tooth 264 is not essential, and only one of the side surfaces may be inclined. Further, the side surfaces of the engaging grooves 260 and the engaging tooth 264 need not be inclined over their entire areas. Namely, the side surfaces of the engaging grooves 260 and the engaging tooth 264 may be inclined only at their portions adjacent to the opening of the grooves 260 or the top of the tooth 264.

The rotary drive member 252, engaging-and-disengaging device 254 and rotary-member rotating device 256 are disposed at the suction-nozzle selecting position. The rotary drive member 252 is a shaft member which is supported by a lower end portion of a bracket 270 fixed to the underside of the frame 100, such that the shaft member is rotatable about a horizontal axis perpendicular to the axis of rotation of the indexing body 126, and is movable in its axial direction. As shown in FIG. 7, a rotary shaft 274 is supported by the lower end portion of the bracket 270 such that the rotary shaft 274 is rotatable but is immovable relative to the bracket 270. The rotary shaft 274 has a bore in which there is fixedly inserted a splined member 272. The rotary drive member 252 has a splined rear end portion remote from the engaging tooth 264, and is splined at this splined rear end portion to the splined member 272, for rotation with the splined member 272 fixed to the rotary shaft 274. In this arrangement, the rotary drive member 252 is axially movable toward and away from the nozzle holder 202 held by the component-holding head 140 carried by the indexing body 126. To the rear end portion of the rotary shaft 274 which extends rearwardly from the bracket 270, there is fixed a bevel gear 280 such that the bevel gear 280 is rotatable with the rotary shaft 274. The nozzle selecting device 250 includes a nozzle selecting motor 282 having an output shaft 284 which carries another bevel gear 286 fixed to its free end, as shown in FIG. 7. The bevel gear 286 is held in meshing engagement with the bevel gear 280, so that a rotary motion of the nozzle selecting motor 282 is transmitted to the rotary drive member 252. The nozzle selecting motor 282 is also supported by the bracket 270. These bevel gears 280, 286 and the nozzle selecting motor 282 constitute a major part of the rotary-member rotating device 256 operable to rotate the rotary drive member 252.

The engaging-and-disengaging device 254 includes a first lever 290, a second lever 292, a connecting rod 294 connecting the first and second levers 290, 292, and a lifting and lowering rod 296, as shown in FIG. 4. A sleeve 300 is fitted on an axially intermediate (almost middle) portion of the rotary drive member 252 such that the sleeve 300 is rotatable and is axially immovable relative to the rotary drive member 252. The sleeve 300 has two pins 302 which project from its outer circumferential surface. The two pins 302 are located at respective two circumferential positions of the sleeve 300 that are opposite to each other in the diametric direction. The first lever 290 is held in engagement with the two pins 302. The first lever 290 is a crank lever, which is supported through a pin 304 by a support member 320 fixed to the bracket 270, such that the first lever 290 is pivotable about the pin 304. The first lever 290 has two arm portions 306, 318, and the arm portion 306 has a bifurcated end portion consisting of a pair of side plates 308 having respective U-shaped cutouts 310 (as shown in FIG. 7). The above-indicated pins 302 of the sleeve 300 are held in engagement with the cutouts 310.

The second lever 292 is a generally elongate plate which is connected at one end thereof through a pin 316 to a bracket 314 fixed to the underside of the frame 100, such that the second lever 292 is pivotable about the pin 316. The connecting rod 294 is pivotally connected at one end thereof to a longitudinally intermediate portion of the second lever 292, and at the other end to the arm portion 318 of the first lever 290, such that the connecting rod 294 extends in the vertical direction. The lifting and lowering rod 296 is pivotally connected at its lower end to the other end of the second lever 292.

The lifting and lowering rod 296 is moved up and down by the intermittent rotary drive motor 114 used as a drive source. A rotary motion of the motor 114 is converted by a motion-converting mechanism (not shown) into a vertical movement of the lifting and lowering rod 296. The motion-converting mechanism includes a cam, a cam follower and a motion-transmitting mechanism which holds the cam follower. Since the intermittent rotary drive motor 114 is kept on, the motion-converting mechanism is arranged to convert the rotary motion of the motor 114 into the vertical motion of the lifting and lowering rod 296 only when the nozzle holder 202 is required to be rotated to select the new suction nozzle 210.

The vertical motion of the lifting and lowering rod 296 causes a pivotal motion of the second lever 292, which in turn causes a vertical motion of the connecting rod 294, which in turn causes a pivotal motion of the first lever 290, so that the rotary drive member 252 is moved between its operating position in which the engaging tooth 264 engages one of the engaging grooves 260, and its non-operating position in which the engaging tooth 264 is spaced apart from the engaging grooves 260.

The rotary drive member 252 is supported, at its front end portion having the engaging tooth 264, by the lower end portion of the support member 320 fixed to the above-indicated bracket 270, such that the rotary drive member 252 is axially movable in the radial direction of the indexing body 126 and is rotatable about its horizontally extending axis of rotation parallel to the radial direction of the indexing body 126. As shown in FIG. 7, a casing 324 is fixed to the lower end portion of the support member 320, and a roller bearing 322 is interposed between the inner circumferential surface of the casing 324 and the outer circumferential surface of the rotary drive member 252, so that the rotary drive member 252 is supported by the casing 324 (support member 320) such that the rotary drive member 252 is rotatable and axially movable relative to the casing 324.

The rotary drive member 252 and the engaging member 262 are connected to each other via a slider coupling or Oldham's coupling 330, which permits the engaging member 262 to be displaced in all radial directions of the rotary drive member 252, that is, in a plane perpendicular to the axis of rotation of the rotary drive member 252. This Oldham's coupling 330, which is constructed as disclosed in JP-A-4-348888, includes a first and a second movable member 334, 336 that are held by a holder portion 332 fixed to the front end portion of the rotary drive member 252. The first and second movable members 334, 336 are movable in mutually perpendicular two directions, respectively. The holder portion 332 has a generally cylindrical section in which the first and second movable members 334, 336 are fitted. A coupling member 338 is fixed to the front end of the holder portion 332 such that the coupling member 338 is coaxial with the holder portion 332. The coupling member 338 and the first movable member 334 have respective pairs of trapezoidal grooves 340, 342 such that the grooves 340 are opposed to the grooves 342. Between the coupling member 332 and the first movable member 334, there are interposed a plurality of balls 344, more precisely, two balls 344, such that the balls 344 are held in engagement with the trapezoidal grooves 340, 342, so that the first movable member 334 is movable in a first diametric direction of the rotary drive member 252, that is, in the horizontal direction. The first and second movable members 334, 336 have respective pairs of trapezoidal grooves 350, 352 such that the grooves 350 are opposed to the grooves 352. Balls 354 are held in engagement with the trapezoidal grooves 350, 352, so that the second movable member 336 is movable in a second diametric direction of the rotary drive member 252 which is perpendicular to the first diametric direction, that is, movable in the vertical direction. A spring 360 is interposed between the second movable member 336 and a connecting member 358 fixed to the holder portion 332, 50 that the spring 360 biases the second movable member 336 toward the first movable member 334. The second movable member 336 has a fitting hole 362 open in a direction away from the first movable member 334. The engaging member 262 having the engaging tooth 264 is coaxially fitted and fixed in the fitting hole 362. The Oldham's coupling 330 thus constructed permits transmission of a rotary motion of the rotary drive member 252 to the engaging tooth 264, and facilitates engagement of the engaging tooth 264 with the engaging grooves 260, owing to the movements of the first and second members 334, 336, even in the presence of a misalignment between the axes of the rotary drive member 252 and the engaging member 262.

A positioning device 368 is provided for normally maintaining a predetermined relative position between the rotary drive member 252 and the engaging member 262 in the plane perpendicular to the axis of the rotary drive member 252. The positioning device 368 permits a movement of the engaging member 262 from the predetermined relative position in any radial direction in the above-indicated plane, when a force acts on the engaging member 262 in that radial direction, for instance, when a force acts on the engaging member 262 in the turning direction of the nozzle holder 202 (component-holding head 140).

In the present embodiment, the positioning device 368 includes four plate springs 370 which are fixed to the outer circumferential surface of the holder portion 332 such that the four plate springs 370 are equiangularly spaced apart from each other in the circumferential direction of the holder portion 332, and are disposed symmetrically with each other with respect to the axis of rotation of the rotary drive member 252, and in alignment with the respective trapezoidal grooves 340, 342, 350, 352. Each of the plate springs 370 has a curved intermediate portion, which is curved in the radially outward direction of the rotary drive member 252. Each plate spring 370 has straight opposite end portions extending in the axial direction of the rotary drive member 252, and is fixed at one of these straight end portions (i.e., at its fixed end portion) to the outer circumferential surface of the holder portion 332, with fixing means in the form of a screw 372. The other end portion (i.e., free end portion) of the plate spring 370 is held in abutting contact with the outer circumferential surface of the second movable member 336. The four plate springs 370 disposed at the respective four equally-spaced circumferential positions of the rotary drive member 252 produce mutually equal biasing forces on the engaging member 262 in the respective four radial directions of the rotary drive member 252, so that the engaging member 262 is kept coaxial with the rotary drive member 252. Described more specifically, a first pair of plate springs 370 opposed to each other in the above-indicated first diametric direction of the rotary drive member 252 bias the engaging member 262 in this first diametric direction, so as to prevent a free movement of the first and second movable members 334, 336 (and accordingly the engaging member 262) relative to the holder portion (rotary drive member 252), in the first diametric direction, while a second pair of plate springs 370 opposed to each other in the above-indicated second diametric direction perpendicular to the first diametric direction bias the engaging member 262 in the second diametric direction, so as to prevent a free movement of the engaging member 262 relative to the rotary drive member 252 in the second diametric direction, whereby the engaging member 262 and the rotary drive member 252 can be normally held in the predetermined relative position in the radial direction, that is, can be normally held coaxially with each other.

When a force acts on the engaging member 262 in the turning direction of the nozzle holder 202, the corresponding two diametrically opposed plate springs 370 are subjected to elastic deformation at their free end portions, permitting a radial movement of the engaging member 262 from the above-indicated predetermined relative position, while the free end portions of the other two plate springs 370 which are spaced from the elastically deformed plate springs 370 by 90° are subjected to sliding movements on the outer circumferential surface of the second movable member 336, permitting the above-indicated radial movement of the engaging member 262.

When the rotary drive member 252 is rotated to rotate the nozzle holder 202 for placing a selected one of the six suction nozzles 210 into the operating position, a passage formed through the selected suction nozzle 210 placed in the operating position is brought into communication with a passage formed through the nozzle holder 202, so that a negative pressure can be applied to the selected suction nozzle 210. The nozzle holder 202 incorporates a positioning device (not shown) for holding the selected suction nozzle 210 in the operating position, so that the selected suction nozzle 210 can be used to mount the electric component 28.

The nozzle selecting motor 282 is a rotary electric motor which is a kind of an electric motor, more precisely, a servomotor whose angle of operation can be accurately controlled. The servomotor may be replaced by a stepping motor. The nozzle selecting device 250 permits the nozzle holder 202 to be rotated in a selected one of opposite directions at an angular pitch of 60°. In the present embodiment, the nozzle holder 202 is rotated in one of the opposite directions which permits the selected suction nozzle 210 to be brought into the operating position with a smaller angle of rotation of the nozzle holder 202. The kind of the suction nozzle 210 placed in the operating position is detected by a suction nozzle detecting device 380 (FIG. 4)

disposed at the suction-nozzle detecting position. The direction and angle of rotation of the nozzle holder 202 are determined on the basis of the detected kind of the suction nozzle 210 presently placed in the operating position and the kind of the suction nozzle 210 to be used next.

The vertically movable rod 170 is provided with a switching valve 386 operable to selectively permit and inhibit the application of the negative pressure to the suction nozzle 210 in the operating position. The switching valve 386 includes a switching sleeve 388 fitted in the vertically movable rod 170 such that the switching sleeve 388 is axially movable relative to the rod 170. The switching sleeve 388 is movable by a switching device 390, between an uppermost position or atmospheric-pressure position in which the suction tube 218 is open to the atmosphere, and a lowermost position or negative-pressure position in which the suction tube 218 is communicated with a negative pressure source. The switching device 390 includes a pusher pin 392 supported by the support member 164, a pusher lever 394 disposed at the component-receiving position, and a bar (not shown) disposed at the component-mounting position. The switching sleeve 388 is moved relative to the vertically movable rod 170, to its negative-pressure position, with a downward movement of the appropriate component-holding head 140 during a turning movement to the component-receiving position, so that the suction tube 218 is communicated with the negative-pressure source, when the head 140 is located at the component-receiving position. The switching sleeve 388 is held in the negative-pressure position while the component-holding head 140 is turned from the component-receiving position to the component-mounting position. When the head 140 has left the component-mounting position, the switching sleeve 388 is moved to the atmospheric-pressure position.

In the present embodiment, the engaging-and-disengaging device 254 and the rotary-member rotating device 256 cooperate to constitute a rotary actuator operable to rotate the engaging member 262. This rotary actuator cooperates with the rotary drive member 252, the engaging member 262 and the Oldham's coupling 330 (serving as a rotation-transmitting device) cooperate to constitute a holder rotating device operable to rotate the nozzle holder 202. The holder rotating device includes an axial-movement permitting device including the splined member 272 and the spline shaft portion 276 which are disposed between a rotary drive source in the form of the nozzle selecting motor 282 and the rotary drive member 252, such that the splined member 272 and the spline shaft portion 276 transmit a rotary motion of the nozzle selecting motor 282 to the rotary drive member 252, while permitting an axial movement of the rotary drive member 252. Further, the splined member 272 and the spline shaft portion 276 constitute a connecting device which connects a first rotary shaft in the form of the rotary shaft 274 and a second rotary shaft in the form of the rotary drive member 252, while permitting an axial movement of the rotary drive member 252 relative to the rotary shaft 274. The holder rotating device indicated above includes the above-indicated first and second rotary shafts, connecting device and axially moving device.

The present electric-component mounting system includes the above-indicated control device 400, which is principally constituted by a computer 410 incorporating a processing unit (PU) 402, a read-only memory (ROM) 404, a random-access memory (RAM) 406, and a bus interconnecting those elements. The bus is connected to an input-output interface 412 to which are connected various sensors such as the suction nozzle detecting device 380. To the input-output interface 412, there are also connected various actuators including the table drive motor 32, X-axis drive motor 48, Y-axis drive motor 56, intermittent rotary drive motor 114, relative-movement motor 190, and nozzle selecting motor 282 through respective driver circuits 416. Like the nozzle selecting motor 282 described above, the other motors such as the motor 32 are servomotors whose operating amounts are detected by respective rotary encoders and which are controlled on the basis of the output signals of the rotary encoders.

To the input-output interface 412, there are also connected the fiducial-mark camera 70 and the component camera 246 through respective control circuits 418. The RAM 406 stores various control programs and data such as component-mounting control programs for mounting the electric components 28 on the printed-wiring boards 38, positioning-error detecting control programs for obtaining the amounts and directions of positioning errors of the electric components 28 with respect to the nominal component-mounting positions on the printed-wiring boards 38, depending upon different patterns of control of the speed of turning movement of the component-holding heads 140.

There will next be described an operation of the present electric-component mounting system constructed as described above. The 16 component-holding heads 140 are intermittently turned with an intermittent rotary movement of the indexing body 126, and temporarily stopped at the 16 working positions, so that the electric component 28 is held by the component-holding head 140 located at the component-receiving position, and is mounted on the printed-wiring board 38 when the same component-holding head 140 is moved to the component-mounting position. When each component-holding head 140 is stopped at the component-upright-attitude detecting position, the component hold-position detecting position and the suction-nozzle detecting position, the respective detecting operations are performed. When the component-holding heads 140 are stopped at the eight working positions described above, the respective working operations are concurrently performed. The operations associated with one of the heads 140 will be described.

When the component-holding head 140 is moved with an intermittent rotary motion of the indexing body 126, the rotation transmitting shaft 172 is rotated independently of the indexing body 126, such that the engaging member 182 reaches each working station before the component-holding head 140. A relative movement between the engaging member 182 and the component-holding head 140 will be explained by reference to the time chart of FIG. 9. In this time chart, the angle of rotation of the cam 112 provided to rotate the indexing body 126 is indicated. The component-holding head 140 is moved from one working position to the next working position and is held stopped at the latter position, during one full rotation of the cam 112.

Figure 9:
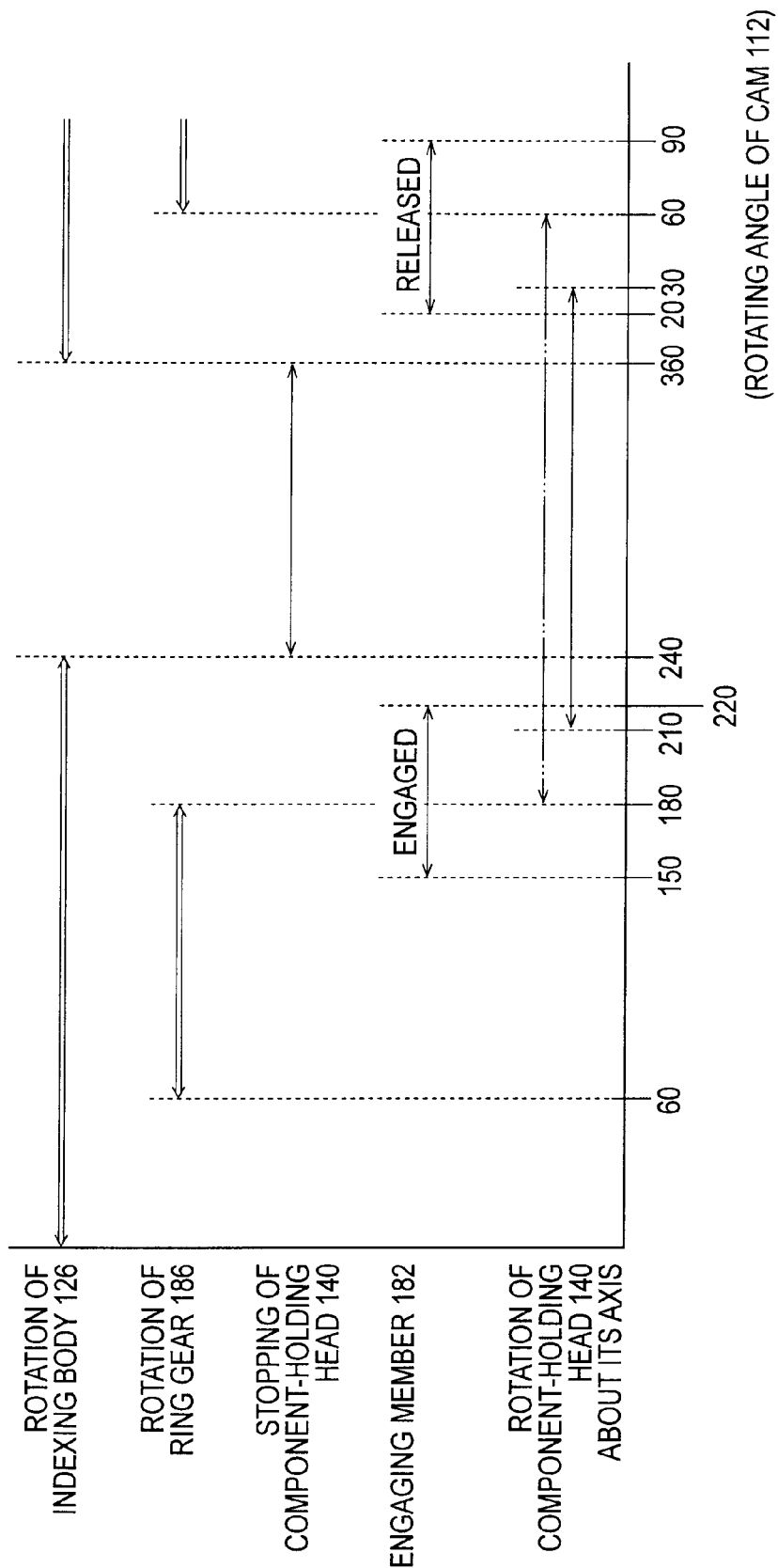
FIG. 9 is a time chart for explaining a non-relative-movement state of an engaging member, and an operation of each component-holding head in the non-relative-movement state, in the component mounting device.

When the cam 112 has been rotated by 60° to rotate the indexing body 126, the rotation of the externally toothed ring gear 186 is initiated. The component-holding head 140 is moved in an initial portion of one rotation of the indexing body 126, during which the externally toothed ring gear 186 of the rotation transmitting shaft 172 is held stopped. The ring gear 186 is rotated until the cam 112 has been rotated by 180°, as indicated in FIG. 9. Since the angular velocity of the ring gear 186 is two times that of the indexing body 126, the engaging member 182 of the rotation transmitting shaft 172 is moved from one working position to the next adjacent working position in a time which is ½ of the time during which the component-holding head 140 is moved between those two working positions. Accordingly, the engaging member 182 whose movement has been initiated after the movement of the head 140 leads the head 140 during the movements of the engaging member 182 and head 140, and reaches the next working position before the head 140 reaches the same position, that is, while the head 140 is still being moved with the indexing body 126.

A movement of the engaging member 182 relative to the component-holding head 140 in the rotating direction of the indexing body 126 is permitted by the universal joints 174, 180. The component-holding head 140 is vertically moved while the indexing body 126 is rotated and the component-holding head 140 is turned about the axis of the indexing body 126. This vertical movement of the component-holding head 140 is permitted by a relative movement between the spline shaft 176 and the sleeve 178.

The relative movements indicated above establish a non-relative-movement state for each of the angular-component-position 90°-changing position, component hold-position rectifying position, angular-head-position resetting position and angular-head-position 90°-reversing position. In this non-relative-movement state, the engaging member 182 is not moved in the rotating direction of the indexing body 126 during the rotation of the indexing body 126, relative to the engaging member of the corresponding one of the angular-component-position 90°-changing device, component hold-position rectifying device, angular-head-position resetting device and angular-head-position 90°-reversing device.

The non-relative-movement state is established for a time period of the initial portion of one rotation of the cam 112 or indexing body 126 (from the 0° position to the 30° position) and a time period of the terminal portion of the rotation of the cam 112 (from the 210° position to the 240° position). In this non-relative-movement state, the component-holding head 140 is turned with the rotary motion of the indexing body 126, but the engaging member 182 is already located at the working position, so that the engaging member 182 can be brought into engagement with the engaging member of the appropriate working device such as the component hold-position rectifying device, for rotating the rotation transmitting shaft 172 to rotate the component-holding head 140, thereby making it possible to perform the appropriate operation such as an operation to rectify the positioning error of the component 28 as held by the head 140.

Accordingly, the engaging member 182 is held stationary relative to the engaging member of the appropriate working device for a total time period as indicated by two-dot chain line in the time chart of FIG. 9. In this time period, the rotation transmitting member 172 can be engaged with and released from the engaging member of the working device such as the component hold-position rectifying device, and the component-holding head 140 can be rotated by the shaft 172 to perform the appropriate operation. Thus, the length of time available for the working device to perform the appropriate working operation in the present electric-component mounting system is almost doubled as compared with the length of time in the conventional system in which the working operation must be performed while the component-holding head 140 is held stopped at the appropriate working position. The present arrangement provides a sufficient time for each working device to perform the appropriate working operation (e.g., operation to rectify the positioning error of the component 28), without having to increase the speed of rotation of the indexing body 126 for reducing the time required for the component-holding head 140 to reach each working position.

Then, the working operations performed by each component-holding head 140 at the individual working positions will be described only briefly, since the working operations are similar to those in a component mounting device as disclosed in JP-A-6-342998. The component-holding head 140 first receives the electric component 28 from the presently selected tape feeder 26, at the component-receiving position. Namely, the head 140 located at the component-receiving position is lowered by the head lifting and lowering device 230, and the negative pressure is applied to the suction nozzle 210, to hold the electric component 28 by suction under the negative pressure. Then, the head 140 is lifted by the device 230, and is then moved with a rotary movement of the indexing body 126, to the component-upright-attitude detecting position at which the component-upright-attitude detecting device (not shown) determines whether the electric component 28 held by the suction nozzle 210 has an upright attitude in which the electric component 28 can not be sucked at one of its opposite major surfaces. If the electric component 28 has the upright attitude, this electric component 28 is not mounted on the printed-wiring board 38 at the component-mounting position at the component-disposing position.

From the component-upright-attitude detecting position, the component-holding head 140 is moved to the angular-component-position 90°-changing position at which the head 140 is rotated clockwise or counterclockwise by 90° by the angular-component-position 90°-changing device, if the angular position in which the electric component 28 is mounted on the printed-wiring board 38 is different by 90° from the angular position in which the electric component 28 has been held by the suction nozzle 210. Then, the head 140 is moved to the component hold-position detecting position at which an image of the electric component 28 as held by the suction nozzle 210 is taken by the component camera 246. Image data representative of the taken image are compared with stored image data representative of nominal horizontal and angular positions of the electric component 28, to obtain horizontal positioning errors $\Delta XE$ and $\Delta YE$ and an angular positioning error $\Delta\theta$ of the electric component 28 as held by the suction nozzle 210. The horizontal positioning errors are errors of the center position of the electric component 28 in the horizontal plane, while the angular positioning error is an error of positioning of the electric component 28 about the axis of the suction nozzle 210.

The component-holding head 140 is then moved to the component hold-position rectifying position at which the head 140 is rotated by a suitable angle, so as to eliminate the obtained angular positioning error $\Delta\theta$. To compensate for the horizontal positioning errors $\Delta XE$ and $\Delta YE$ of the electric component 28 as held by the suction nozzle 210, board-positioning data to position the printed-wiring board 38 for mounting the electric component 28 thereon are adjusted. The board-positioning data are also adjusted to compensate for horizontal relative positioning errors $\Delta XP$ and $\Delta YP$ of the printed-wiring board 38 relative to the PWB supporting device 40 in the horizontal plane. To this end, the horizontal positioning errors $\Delta XP$ and $\Delta YP$ of the board 38 positioned on the PWB supporting device 40 are calculated on the basis of images of the fiducial marks taken by the fiducial-mark camera 70. X-axis movement data and Y-axis movement data of the board-positioning data used to position the printed-wiring board 38 in the XY plane are adjusted to compensate for the thus obtained horizontal positioning errors $\Delta XP$ and $\Delta YP$ of each component-mounting spot on the board 38, the horizontal positioning errors $\Delta XE$ and $\Delta YE$ of the electric component 28 as held by the suction nozzle 210, and changes of the center position of the electric component 28 in the X-axis and Y-axis direction, which changes take place due to the compensation for the angular positioning error Δθ of the electric component 28. Then, the component-holding head 140 is moved to the component-holding position at which the electric component 28 is transferred from the component-holding head 140 onto the corresponding mounting spot on the printed-wiring board 38. Thus, the electric component 28 can be mounted in the predetermined attitude, at the nominal mounting position on the board 38.

The component-holding head 140 located at the component-mounting position is vertically moved by the head lifting and lowering device 230, like the head 140 located at the component-receiving position. At the component-mounting position, the suction nozzle 210 is lowered to mount the electric component 28 onto the printed-wiring board 38, brought into communication with the atmosphere, and then lifted.

Then, the component-holding head 140 is moved to the angular-head-position resetting position at which the head 140 is rotated by Δθ in the direction opposite to the direction in which the head 140 was rotated at the component hold-position rectifying position, to the angular position before it was rotated at the component hold-position rectifying position. Then, the head 140 is moved to the angular-head-position 90°-reversing position at which the head 140 is rotated by 90° in the direction opposite to the direction in which the head 140 was rotated at the angular-component-position 90°-changing position. Thus, the head 140 is restored to its original angular position if the head 140 was rotated at the angular-component-position 90°-changing position.

Then, the component-holding head 140 is moved to the component disposing position to discard the electric component 28 which was detected to be unable to be mounted on the board 38, for example: the electric component 28 which was detected, at the component-upright-attitude detecting position, to have an upright attitude; the electric component 28 which was detected, at the component hold-position detecting position, to have positioning errors that are too large to be eliminated at the component hold-position rectifying position; and the electric component 28 the geometry of which was detected to be excessively different from the nominal geometry, due to local chipping or breakage.

The component-holding head 140 is then moved to the suction-nozzle detecting position at which the nozzle detecting device 380 detects the kind of the suction nozzle 210 presently placed in the operating position. The head 140 is then moved to the suction-nozzle selecting position at which the nozzle selecting device 250 is operated if the kind of the suction nozzle 210 presently placed in the operating position is different from that of the suction nozzle 210 to be used for the electric component 28 to be mounted next. Namely, the nozzle holder 202 is rotated to bring the appropriate suction nozzle 210 into the operating position.

The component-holding head 140 from which the electric component 28 has been transferred onto the printed-wiring board 38 is rotated by the angular-head-position resetting device and angular-head-position 90°-reversing device, to its original angular position, so that the detection and selection of the suction nozzle 210 at the respective suction-nozzle detecting and selecting positions and the suction of the electric component 28 by the suction nozzle 210 at the component-receiving position are effected while the component-holding head 140 is placed in the original angular position in which the axis of rotation of the nozzle holder 202 extends in the radial direction of the indexing body 126, so that the nozzle detecting device 380 can detect the kind of the suction nozzle 210 placed in the operating position, and the nozzle holder 202 can be rotated by the rotary drive member 252 of the nozzle selecting device 250, with the engaging teeth 264 held in engagement with the engaging grooves 260.

There will be described an operation of the nozzle selecting device 250 to rotate the nozzle holder 202 to place a selected one of the suction nozzles 210 into the operating position. Referring to the time chart of FIG. 10, a relative movement between the engaging member 262 and the nozzle holder 202 (component-holding head 140) will be described. In the time chart of FIG. 10, the angle of rotation of the cam 112 to rotate the indexing body 126 is taken along the abscissa, while the displacements of the engaging member 262 and the nozzle holder 202 are taken along the ordinate. The time chart shows a turning motion of the nozzle holder 202 and an axial movement of the engaging member 262, before during and after rotation of the nozzle holder 202 to select the suction nozzle 210 to be used next. As the nozzle holder 202 of the appropriate component-holding head 140 is turned toward the suction-nozzle selecting position, the speed of the turning movement of the indexing body 126 (nozzle holder 202) is reduced. The engaging-and-disengaging device 254 is activated to initiate an axial movement of the engaging member 262 toward the nozzle holder 202, during the turning movement of the nozzle holder 202 toward the suction-nozzle selecting position, and before the nozzle holder 202 has reached the suction-nozzle selecting position.

Figure 10:
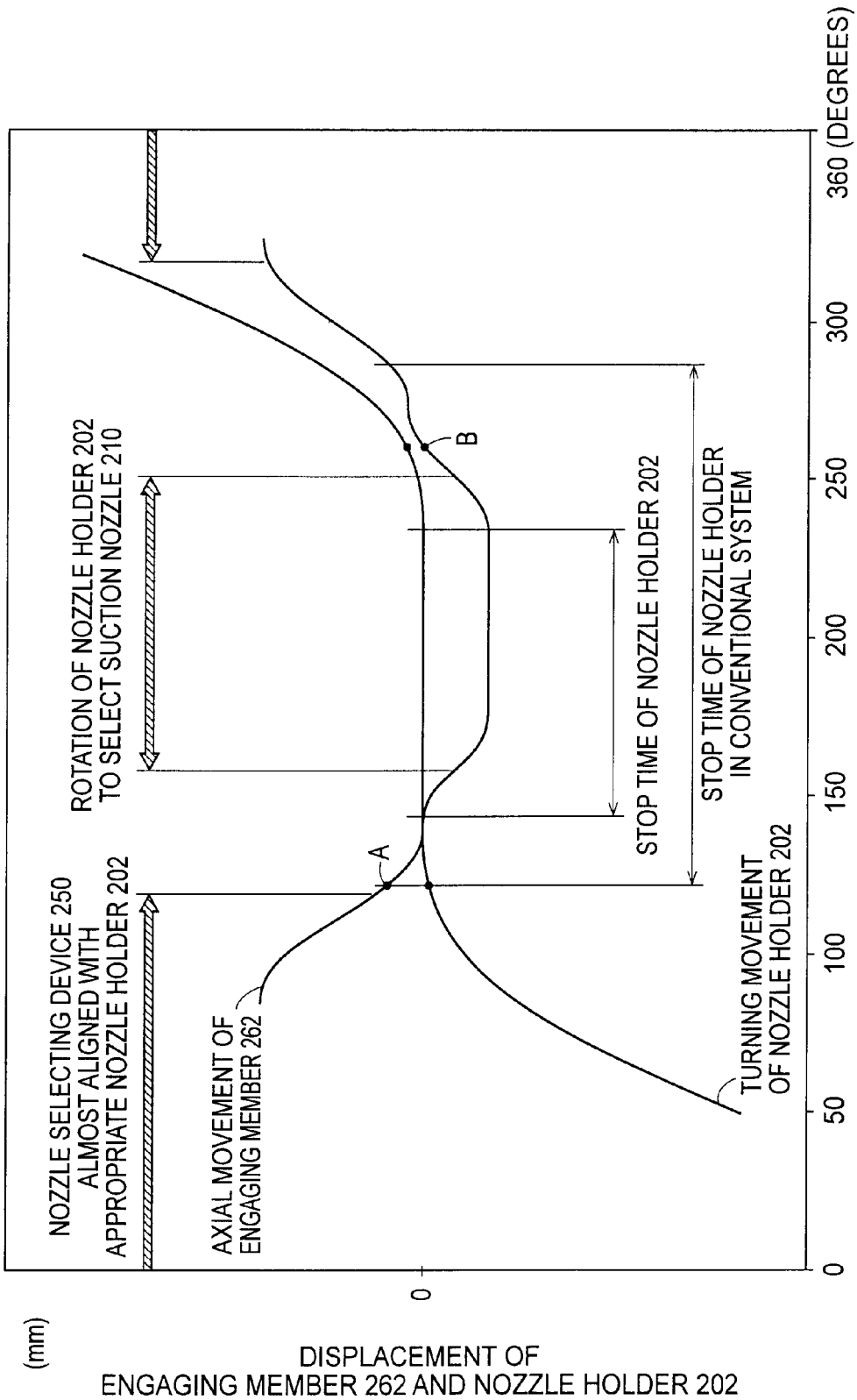
FIG. 10 is a time chart for explaining operations of the component-holding head and the nozzle selecting device at a suction-nozzle selecting position.

At point A indicated in FIG. 10, the engaging member 262 initially contacts the nozzle holder 202. At this time, the width center of the engaging tooth 264 of the engaging member 262 is offset from that of the appropriate engaging groove 260 of the nozzle holder 202, by a small distance on the downstream side of the engaging groove 260 as seen in the turning direction of the nozzle holder 202, as indicated in FIG. 11. However, the top of the engaging tooth 264 is already located within the width of the opening of the engaging groove 260, so that the engaging tooth 264 can be brought into full engagement with the engaging groove 260. During the deceleration of the turning movement of the nozzle holder 202, the engaging member 262 is further moved in the axial direction toward the nozzle holder 202, so that the engagement of the engaging tooth 264 with the engaging groove 260 further proceeds. In this process, the inclined side surfaces of the engaging tooth 264 and the engaging groove 260 provide a guiding function to facilitate a displacement of the engaging member 262 relative to the rotary drive member 252, on the upstream of the nozzle holder 202 as seen in the turning direction. This relative displacement, which is permitted by the Oldham's coupling 330, permits complete engagement of the engaging tooth 264 with the engaging groove 260.

As described above, the speed of the axial movement of the engaging member 262 with the rotary drive member 252 toward the nozzle holder 202 is smoothly reduced, and this axial movement is temporarily stopped upon completion of the engagement between the engaging tooth 264 and the engaging groove 260. As the engagement between the engaging tooth and groove 264, 260 proceeds, the engaging member 262 is temporarily offset or misaligned relative to the rotary drive member 252 in the radial direction, but is subsequently restored into coaxial alignment with the rotary drive member 252 as the nozzle holder 202 is turned to be stopped at the suction-nozzle selecting position. When the nozzle holder 202 has reached the suction-nozzle selecting position, the engagement between the engaging tooth 264 and the engaging groove 260 is completed. Thus, the advancing speed of the engaging member 262 in the process of the engagement of the engaging tooth 264 with the engaging groove 260 is lowered to permit slow movements of the engaging member 262 in the radial direction from and back to the coaxial position with respect to the rotary drive member 252. Accordingly, the engagement between the engaging tooth 264 and the engaging groove 260 can be effected without an impact, although the engagement is initiated during the turning movement of the nozzle holder 202 to the suction-nozzle selecting position.

After the complete engagement between the engaging tooth 264 and the engaging groove 260, the rotary drive member 252 and the engaging member 262 are again advanced with a gradual increase of the advancing speed, to move the nozzle holder 202 against a biasing force of a spring (not shown), by a small distance in the right direction as seen in FIG. 4, so that a positioning pin provided on the nozzle holder 202 and a positioning hole provided in the support member 200, which have been held in engagement with each other to lock the nozzle holder 202, are disengaged from each other. Immediately after the disengagement of the positioning pin from the positioning hole, the nozzle selecting motor 282 is turned on to rotate the engaging member 262 with the rotary drive member 252. With the engaging tooth 264 now in engagement with the engaging groove 260, a rotary motion of the rotary drive member 252 is transmitted to the nozzle holder 202, so that the nozzle holder 202 is rotated by an angle necessary to bring the selected one of the suction nozzles 210 into the operating position. In the example of FIG. 10, the nozzle holder 202 is rotated by 60° to bring the selected suction nozzle 210 into the operating position. Where the nozzle holder 202 is rotated more than 60° to select the desired suction nozzle 210, the operating speed of the intermittent rotary drive motor 114 is reduced, to increase the time during which the nozzle holder 202 is held stopped at the suction-nozzle selecting position. This arrangement allows a time sufficient to permit the rotation of the nozzle holder 202 by the required angle, while minimizing the reduction of the component mounting efficiency of the system 12. However, the operating speed of the intermittent rotary drive motor 114 may be reduced or determined so as to permit the required maximum angle of rotation of the suction nozzle, for all of the working positions.

The present embodiment is adapted so that the elongate straight engaging tooth 264 engaging the appropriate engaging groove 260 extends in the horizontal direction when the desired suction nozzle 210 is placed in the operating position. That is, the angle of rotation of the engaging member 262 for rotating the nozzle holder 202 to bring the desired suction nozzle 210 into the operating position is calculated before the engagement of the engaging tooth 264 with the appropriate engaging groove 260, so that the engaging tooth 264 has the horizontal attitude after its rotation, and so that the engaging tooth 264 is engageable with the engaging groove 260 which is angularly spaced from the presently horizontally extending engaging groove 260 (see FIG. 6), by an angle equal to the angle of rotation of the engaging tooth 264 required to bring the desired suction nozzle 210 into the operating position. The horizontal direction is parallel to a line of tangency to a circle along which the nozzle holder 202 is turned by the indexing body 126.

After the nozzle holder 202 has been held stationary for a predetermined time at the suction-nozzle selecting position, and while the nozzle holder 202 is still being rotated, the turning movement of the nozzle holder 202 is resumed. That is, the nozzle holder 202 is moved on the downstream side as seen in the rotating direction of the indexing body 126, namely, toward the component-receiving position. As a result, the engaging member 262 the engaging tooth 264 of which is still in engagement with the engaging groove 260 is moved relative to the rotary drive member 252 in the turning direction of the nozzle holder 202. This relative movement is permitted by the Oldham's coupling 330, which connects the engaging member 262 and the rotary drive member 252, so as to permit the engaging member 262 to be moved relative to the rotary drive member 252 in all radial directions, so that the engaging tooth 264 can be held in engagement with the engaging groove 260 as indicated in FIG. 12, permitting the rotary motion of the rotary drive member 252 to be continuously transmitted to the nozzle holder 202, to continue the rotation of the nozzle holder 202 for bringing the desired suction nozzle 210 into the operating position. When the desired suction nozzle 210 has been brought into the operating position, the engaging tooth 264 and the engaging groove 260 extend in the horizontal direction. That is, the direction of extension of the engaging tooth and groove 264, 260 is almost parallel to the horizontal direction in the terminal portion of the rotation of the nozzle holder 202 for bringing the desired suction nozzle 210 into the operating position, so that the movement of the engaging member 262 relative to the engaging groove 260 in the turning direction of the nozzle holder 202 (i.e., in the horizontal direction) is more or less permitted. However, a resistance of friction between the engaging tooth and groove 264, 260 prevents a completely free movement of the engaging tooth 264 relative to the engaging groove 260. In view of this tendency, the present embodiment uses the Oldham's coupling 330, which permits the engaging member 262 to be moved relative to the rotary drive member 252 in the turning direction of the nozzle holder 202. The Oldham's coupling 330 is effective to permit the nozzle holder 202 to be rotated for bringing the desired suction nozzle 210 into the operating position, even after the turning movement of the nozzle holder 202 from the suction-nozzle selecting position is resumed.

While it is preferable that the engaging tooth and groove 264, 260 extend in the horizontal direction, that is, in the turning direction of the nozzle holder 202, upon completion of the rotation of the nozzle holder 202 to bring the desired suction nozzle 210 into the operating position, this is not essential. Namely, the direction of extension of the engaging tooth and groove 264, 260 upon completion of the rotation of the nozzle holder 202 may be inclined or perpendicular to the horizontal direction. In this case, too, the Oldham's coupling 330 permits continued rotation of the nozzle holder 202 to bring the desired suction nozzle 210 into the operating position, even after the initiation of the turning movement of the nozzle holder 202 from the suction-nozzle selecting position, since the Oldham's coupling 330 permits the movement of the engaging member 262 relative to the rotary drive member 252 in all radial directions of the rotary drive member 252.

In the terminal portion of the rotation of the nozzle holder 202 to bring the desired suction nozzle 210 into the operating position, a retracting movement of the rotary drive member 252 and the engaging member 262 is initiated by the engaging-and-disengaging device 254, and the nozzle holder 202 is axially moved in the left direction as seen in FIG. 4, so that the above-indicated positioning pin is inserted into the above-indicated positioning hole, for thereby preventing a rotary motion of the nozzle holder 202. The leftward movement of the nozzle holder 202 is terminated by a stop member (not shown), but the retracting movement of the rotary drive member 252 and the engaging member 262 is continued, so that the engaging tooth 264 is disengaged from the engaging groove 260. When the engaging tooth 264 is disengaged from the engaging groove 260, the engaging member 262 has been moved by a given distance relative to the rotary drive member 252 in the radial direction (on the downstream side as seen in the turning direction of the nozzle holder 202), as described above. Accordingly, the engaging member 262 is returned by the biasing forces of the plate springs 370, to the original position in which the engaging member 262 is coaxial with the rotary drive member 252. As is apparent from FIG. 10, the speed of the retracting movement of the rotary drive member 252 and the engaging member 262 is gradually reduced to zero, and is then increased. This reduction of the speed of the retracting movement of the rotary drive member 252 and the engaging member 262 upon disengagement of the engaging tooth 264 from the engaging groove 260 permits the disengagement and the radial return movement of the engaging member 262 to take place in a gradual manner.

In the present embodiment, a cam is used to vertically move the lifting and lowering rod 296 for converting a rotary motion of the intermittent rotary drive motor 114 into linear advancing and retracting motions of the rotary drive member 252, for engagement and disengagement of the engaging tooth 264 with and from the engaging groove 260. As is apparent from FIG. 10, a curve of the cam for the disengagement of the engaging tooth 264 from the engaging groove 260 is made symmetrical with a curve of the cam for the engagement of the engaging tooth 264 with the engaging groove 260. This arrangement is advantageous for easy designing and manufacture of the cam. However, the present arrangement of the cam is not essential, that is, the speed of the retracting movement of the engaging member 262 need not be once zeroed. For example, the engaging member 262 may be retracted at a predetermined constant speed.

After the engaging tooth 264 has been disengaged from the engaging groove 260, the engaging member 262 is retracted away from the nozzle holder 202 at a comparatively high speed, back to the original axial position. In this original axial position, the rotary drive member 252 is rotated in the reverse direction back to the original angular position for preparation for the next operation of the nozzle selecting device 250.

In the present embodiment, the engagement of the engaging tooth 264 with the appropriate engaging groove 260 is initiated before the turning movement of the nozzle holder 202 to the suction-nozzle selecting position is completed, and the rotation of the nozzle holder 202 to bring the desired suction nozzle 210 into the operating position is continued with the engaging tooth 264 held in engagement with the engaging groove 260 even after the turning movement of the nozzle holder 202 toward the component-receiving position is initiated. Accordingly, the length of time during which the nozzle holder 202 is held stopped at the suction-nozzle selecting position is made shorter in the present embodiment, than in the Ezra conventional nozzle selecting device in which the engaging member is formed integrally with the rotary drive member. In the example of FIG. 10, the required stop time of the nozzle holder 202 is about a half of that in the conventional nozzle selecting device. However, the present embodiment provides a sufficient time for the intended engagement and disengagement of the engaging tooth 264 with and from the engaging groove 260, and for the required rotation of the nozzle holder 202, making it possible to bring the desired suction nozzle 210 into the operating position with high accuracy. In addition, the present embodiment is arranged to prevent an excessive load acting on the drive source (nozzle selecting motor 282) of the rotary-member rotating device 256, leading to increased durability of the nozzle selecting device 250. The present inventors attempted to operate the conventional nozzle selecting device with the stop time of the nozzle holder being reduced a time almost equal to the stop time in the present embodiment, this attempt was not successful due to an insufficient response of the engaging and disengaging actions of the engaging member to the profile of the relevant cam, and an overload of the drive source of the rotary-member rotating device. The efficiency of mounting of the electric components in the electric-component mounting system 12 can be increased with a decrease of the stop time during which the nozzle holder 202 is required to be stopped at the suction-nozzle selecting position.

While the presently preferred embodiment of this invention has been described in detail, for illustrative purpose only, it is to be understood that the present invention may be embodied with various changes, modifications and improvements, such as those described in the SUMMARY OF THE INVENTION, which may occur to those skilled in the art, without departing from the spirit and scope of the invention defined in the following claims:

What is claimed is:

1. An electric-component mounting system for mounting an electric component onto a circuit substrate, comprising:

a plurality of nozzle holders each of which carries a plurality of suction nozzles and is rotatable to bring a selected one of the suction nozzles into an operating position thereof, said each nozzle holder having an engaging portion;

a turning device operable to turn said plurality of nozzle holders about a common axis of turning, for sequentially stopping each of said nozzle holders at a plurality of predetermined working positions including a nozzle-selecting position, a component-receiving position and a component-mounting position, so that said each nozzle holder receives an electric component at said selected one suction nozzle placed in said operating position, when said each nozzle holder is located at said component-receiving position, and mounts said electric component onto said circuit substrate when said each nozzle holder is located at said component-mounting position;

a holder rotating device including an engaging member engageable with and disengageable from said engaging portion of said each nozzle holder, said holder rotating device being disposed at said nozzle-selecting position and operable to rotate the nozzle holder located at said nozzle selecting position, while said engaging member is in engagement with said engaging portion so that said selected one of said suction nozzles is brought into said operating position in which said selected suction nozzle extends in the vertical direction; and an engaging-and-disengaging device operable to move said engaging member for engagement and disengagement with and from said engaging portion, wherein said holder rotating device further includes (i) a rotary member holding said engaging member and rotatable with said engaging member, (ii) a rotary drive device operable to rotate said rotary member and said engaging member, and (iii) a rotation transmitting device interposed between said engaging member and said rotary member and operable to transmit a rotate motion of said rotary member to said engaging member, while permitting said engaging member to be moved in at least said direction of turning of said each nozzle holder by said turning device, and said engaging-and-disengaging device moves said engaging member in an axial direction of said rotary member, for effecting engagement and disengagement of said engaging member with and from said engaging portion of said each nozzle holder, and is operable to hold said engaging member in engagement with said engaging portion of said each nozzle holder, for at least a predetermined period of time after initiation of a turning movement of said each nozzle holder by said turning device from said nozzle-selecting position toward said component-receiving position.

2. The electric-component mounting system for mounting an electric component onto a circuit substrate according to claim 1, wherein said rotation transmitting device permits said engaging member to be moved relative to said rotary member in all radial directions of said rotary member.

3. The electric-component mounting system for mounting an electric component onto a circuit substrate according to claim 2, wherein said rotation transmitting device includes an Oldham's coupling.

4. The electric-component mounting system for mounting an electric component onto a circuit substrate according to claim 1, wherein said holder rotating device includes:

a stationary rotary drive source; and an axial-movement permitting device interposed between said stationary rotary drive source and said rotary member and operable to transmit a rotary motion of said rotary drive source to said rotary member while permitting a movement of said rotary member in an axial direction thereof.

5. The electric-component mounting system for mounting an electric component onto a circuit substrate according to claim 1, wherein said each nozzle holder is rotatable about an axis which is perpendicular to said common axis of turning of said plurality of nozzle holders.

6. The electric-component mounting system for mounting an electric component onto a circuit substrate according to claim 1, wherein said turning device includes:

an indexing body rotatable about said common axis of turning;

an intermittently rotating device operable to rotate said indexing body at a predetermined angular pitch; and a plurality of nozzle-holder holding members disposed on said indexing body such that said nozzle-holder holding members are spaced apart from each other in a circumferential direction of said indexing body, said nozzle-holder holding members holding said plurality of nozzle holders, respectively, such that said each nozzle holder is rotatable.

7. The electric-component mounting system for mounting an electric component onto a circuit substrate according to claim 6, wherein each of said nozzle-holder holding members comprises a holder shaft disposed on said indexing body such that said holder shaft is rotatable, said electric-component mounting system further including a nozzle rotating device operable to rotate said holder shaft for rotating the corresponding nozzle holder about a centerline of said selected suction nozzle placed in said operating position.

8. The electric-component mounting system for mounting an electric component onto a circuit substrate according to claim 6, wherein each of said nozzle-holder holding members comprises a holder shaft disposed on said indexing body such that said holder shaft is axially movable, said electric-component mounting system further including a nozzle moving device operable to move said holder shaft in an axial direction for moving the corresponding nozzle holder in a direction parallel to a centerline of said selected suction nozzle placed in said operating position.

9. An electric-component mounting system for mounting an electric component onto a circuit substrate, comprising:

a plurality of nozzle holders each of which carries a plurality of suction nozzles and is rotatable to bring a selected one of the suction nozzles into an operating position thereof, said each nozzle holder having an engaging portion;

a turning device operable to turn said plurality of nozzle holders about a common axis of turning, for sequentially stopping each of said nozzle holders at a plurality of predetermined working positions including a nozzle-selecting position, a component-receiving position and a component-mounting position, so that said each nozzle holder receives an electric component at said selected one suction nozzle placed in said operating position, when said each nozzle holder is located at said component-receiving position, and mounts said electric component onto said circuit substrate when said each nozzle holder is located at said component-mounting position;

a holder rotating device including an engaging member engageable with and disengageable from said engaging portion of said each nozzle holder, said holder rotating device being disposed at said nozzle-selecting position and operable to rotate the nozzle holder located at said nozzle selecting position, while said engaging member is in engagement with said engaging portion so that said selected one of suction nozzles is brought into said operating position in which said selected suction nozzle extends in the vertical direction; and an engaging-and-disengaging device operable to move said engaging member for engagement and disengagement with and from said engaging portion, wherein said holder rotating device includes a positioning device which normally holds a predetermined relative position of said engaging member and said rotary member, and which permits a movement of said engaging member from said predetermined relative position when a force acts on said engaging member in said direction of turning of said each nozzle holder.

10. The electric-component mounting system for mounting an electric component onto a circuit substrate according to claim 9, wherein said positioning device includes at least one spring which is held in engagement with said engaging member and said rotary member, at respective opposite ends thereof.

11. The electric-component mounting system for mounting an electric component onto a circuit substrate according to claim 10, wherein said at least one spring consists of at least three plate springs which are arranged in a circumferential direction of said rotary member, each of said at least three plate springs being fixed at a fixed end thereof to one of said engaging member and said rotary member, and extending toward the other of said engaging member and said rotary member, said each plate spring being held in contact with said other of said engaging member and said rotary member such that said each plate spring is slidable on said other of said engaging member and said rotary member.

12. An electric-component mounting system for mounting an electric component onto a circuit substrate, comprising:
- a plurality of nozzle holders each of which carries a plurality of suction nozzles and is rotatable to bring a selected one of the suction nozzles into an operating position thereof, said each nozzle holder having an engaging portion;
- a turning device operable to turn said plurality of nozzle holders about a common axis of turning, for sequentially stopping each of said nozzle holders at a plurality of predetermined working positions including a nozzle-selecting position, a component-receiving position and a component-mounting position, so that said each nozzle holder receives an electric component at said selected one suction nozzle placed in said operating position, when said each nozzle holder is located at said component-receiving position, and mounts said electric component onto said circuit substrate when said each nozzle holder is located at said component-mounting position;
- a holder rotating device including an engaging member engageable with and disengageable from said engaging portion of said each nozzle holder, said holder rotating device being disposed at said nozzle-selecting position and operable to rotate the nozzle holder located at said nozzle selecting position, while said engaging member is in engagement with said engaging portion so that said selected one of suction nozzles is brought into said operating position in which said selected suction nozzle extends in the vertical direction; and
- an engaging-and-disengaging device operable to move said engaging member for engagement and disengagement with and from said engaging portion, wherein said holder rotating device includes:
- a first rotary shaft disposed such that said first rotary shaft is rotatable and axially immovable;
- a second rotary shaft disposed such that said second rotary shaft is rotatable and axially movable;
- a connecting device which connects said first and second rotary shafts to each other, so as to permit an axial movement of said second rotary shaft relative to said first rotary shaft;
- an axially moving device operable to move said second rotary shaft in the axial direction; and
- a stationary rotary drive source operable to rotate said first rotary shaft,
- wherein said second rotary shaft functions as said rotary member, while said axially moving device functions as said engaging-and-disengaging device.

13. An electric-component mounting system for mounting an electric component onto a circuit substrate, comprising:
- a plurality of nozzle holders each of which carries a plurality of suction nozzles and is rotatable to bring a selected one of the suction nozzles into an operating position thereof, said each nozzle holder having an engaging portion;
- a turning device operable to turn said plurality of nozzle holders about a common axis of turning, for sequentially stopping each of said nozzle holders at a plurality of predetermined working positions including a nozzle-selecting position, a component-receiving position and a component-mounting position, so that said each nozzle holder receives an electric component at said selected one suction nozzle placed in said operating position, when said each nozzle holder is located at said component-receiving position, and mounts said electric component onto said circuit substrate when said each nozzle holder is located at said component-mounting position;
- a holder rotating device including an engaging member engageable with and disengageable from said engaging portion of said each nozzle holder, said holder rotating device being disposed at said nozzle-selecting position and operable to rotate the nozzle holder located at said nozzle selecting position, while said engaging member is in engagement with said engaging portion so that said selected one of suction nozzles is brought into said operating position in which said selected suction nozzle extends in the vertical direction; and
- an engaging-and-disengaging device operable to move said engaging member for engagement and disengagement with and from said engaging portion, wherein said engaging portion of said each nozzle holder has a plurality of straight engaging grooves formed in an end face of said each nozzle holder which is perpendicular to an axis of rotation of said each nozzle holder, said straight engaging grooves intersecting each other on said axis of rotation of said each nozzle holder, said engaging member including a straight engaging tooth engageable with a selected one of said plurality of straight engaging grooves, and wherein said nozzle rotating device is operable to rotate said engaging member to an angular position in which said straight engaging tooth extends in a direction substantially parallel to a line of tangency to a circle along which said each nozzle holder is turned, said straight engaging tooth extending in said direction substantially parallel to said line of tangency when said straight engaging tooth is engaged with or disengaged from said selected one straight engaging groove.

* * * * *